US011799266B2

(12) United States Patent
Tanuma

(10) Patent No.: US 11,799,266 B2
(45) Date of Patent: Oct. 24, 2023

(54) SEMICONDUCTOR LIGHT-EMITTING DEVICE

(71) Applicant: ROHM CO., LTD., Kyoto (JP)

(72) Inventor: Yuki Tanuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 159 days.

(21) Appl. No.: 16/673,519

(22) Filed: Nov. 4, 2019

(65) Prior Publication Data
US 2020/0144784 A1  May 7, 2020

(30) Foreign Application Priority Data

Nov. 6, 2018  (JP) .................................. 2018-208521

(51) Int. Cl.
*H01S 5/02257* (2021.01)
*H01S 5/02315* (2021.01)
(Continued)

(52) U.S. Cl.
CPC ...... *H01S 5/02257* (2021.01); *H01S 5/02216* (2013.01); *H01S 5/02315* (2021.01); *H01L 2224/32245* (2013.01); *H01L 2224/48227* (2013.01); *H01L 2224/48471* (2013.01); *H01L 2224/49175* (2013.01); *H01L 2924/16195* (2013.01); *H01S 5/0237* (2021.01);
(Continued)

(58) Field of Classification Search
CPC ............. H01S 5/02208; H01S 5/02216; H01L 2924/16195; H01L 23/10
See application file for complete search history.

(56) References Cited

U.S. PATENT DOCUMENTS 8,564,968 B1 * 10/2013 Heo ................... H01L 23/49548
361/767
8,829,632 B2 * 9/2014 Fuse ................. H01L 27/14618
257/434

(Continued)

FOREIGN PATENT DOCUMENTS

JP     2003077160 A     3/2003
JP     2006049657 A     2/2006
(Continued)

OTHER PUBLICATIONS

Japanese Office Action in the counterpart Japanese application No. 2018-208521 dated Jul. 5, 2022.

*Primary Examiner* — Sean P Hagan
(74) *Attorney, Agent, or Firm* — Rabin & Berdo, P.C.

(57) ABSTRACT

A semiconductor light-emitting device, includes: a semiconductor light-emitting element; a support including a base and a conductive part and configured to support the semiconductor light-emitting element; and a cover configured to overlap the semiconductor light-emitting element as viewed in a first direction, and to transmit light from the semiconductor light-emitting element, wherein the cover includes a base layer having a front surface and a rear surface which transmit the light from the semiconductor light-emitting element and face opposite sides to each other in the first direction, wherein the rear surface faces the semiconductor light-emitting element, wherein the base layer includes a plurality of undulation parts bonded to the support by a bonding material, and wherein the undulation parts are more uneven than the rear surface.

19 Claims, 15 Drawing Sheets

(51) Int. Cl.
*H01S 5/02216* (2021.01)
*H01S 5/42* (2006.01)
*H01S 5/0237* (2021.01)
*H01S 5/343* (2006.01)
*H01S 5/02335* (2021.01)
*H01S 5/183* (2006.01)
*H01S 5/02345* (2021.01)

(52) U.S. Cl.
CPC ....... *H01S 5/02335* (2021.01); *H01S 5/02345* (2021.01); *H01S 5/18313* (2013.01); *H01S 5/18347* (2013.01); *H01S 5/3432* (2013.01); *H01S 5/34353* (2013.01); *H01S 5/423* (2013.01)

(56) References Cited

U.S. PATENT DOCUMENTS

| | | | | |
|---|---|---|---|---|
| 2002/0084532 A1* | 7/2002 | Neogi | ............... | H01L 21/50 257/796 |
| 2004/0238944 A1* | 12/2004 | Bish | ............... | H01L 23/3675 257/706 |
| 2012/0267671 A1* | 10/2012 | Jung | ............... | H01L 33/486 257/99 |
| 2013/0234274 A1* | 9/2013 | Kam | ............... | H01L 33/58 257/432 |
| 2014/0226308 A1* | 8/2014 | Fukuda | ............... | F21V 31/005 362/84 |
| 2015/0155221 A1* | 6/2015 | Chen | ............... | H01L 24/81 257/690 |
| 2016/0126426 A1* | 5/2016 | Kim | ............... | H01L 33/486 257/98 |
| 2017/0117443 A1* | 4/2017 | Kim | ............... | H01L 33/486 |
| 2020/0036161 A1* | 1/2020 | Kim | ............... | H01S 5/02469 |

FOREIGN PATENT DOCUMENTS

| | | |
|---|---|---|
| JP | 2015-123378 A | 7/2015 |
| JP | 2017033971 A | 2/2017 |
| WO | 2013061511 A1 | 5/2013 |

* cited by examiner

SEMICONDUCTOR LIGHT-EMITTING DEVICE

CROSS-REFERENCE TO RELATED APPLICATION

This application is based upon and claims the benefit of priority from Japanese Patent Application No. 2018-208521, filed on Nov. 6, 2018, the entire contents of which are incorporated herein by reference.

TECHNICAL FIELD

The present disclosure relates to a semiconductor light-emitting device.

BACKGROUND

Semiconductor light-emitting devices including semiconductor light-emitting elements as light sources have been widely proposed. In the related art, an example of a conventional semiconductor light-emitting device is disclosed. The semiconductor light-emitting device disclosed in the related art includes a semiconductor laser element which is an example of a semiconductor light-emitting element, a substrate on which the semiconductor light-emitting element is mounted, a case that surrounds the semiconductor light-emitting element, and a light-transmitting cover that closes the case.

When the cover is detached from the case, light from the semiconductor light-emitting element is likely to be visually recognized directly by the naked eye, which is not desirable.

SUMMARY

Some embodiments of the present disclosure provide a semiconductor light-emitting device capable of suppressing detachment of a cover.

According to one embodiment of the present disclosure, there is provided a semiconductor light-emitting device, including: a semiconductor light-emitting element; a support including a base and a conductive part and configured to support the semiconductor light-emitting element; and a cover configured to overlap the semiconductor light-emitting element as viewed in a first direction, and to transmit light from the semiconductor light-emitting element, wherein the cover includes a base layer having a front surface and a rear surface which transmit the light from the semiconductor light-emitting element and face opposite sides to each other in the first direction, wherein the rear surface faces the semiconductor light-emitting element, wherein the base layer includes a plurality of undulation parts bonded to the support by a bonding material, and wherein the undulation parts are more uneven than the rear surface.

Other features and advantages of the present disclosure will become more apparent from the detailed description given below with reference to the accompanying drawings.

DETAILED DESCRIPTION

Embodiments of the present disclosure will now be described in detail with reference to the drawings.

The terms "first," "second," "third," and the like herein are simply used as labels, and are not necessarily intended to establish an order among objects.

First Embodiment

FIGS. 1 to 12 illustrate a semiconductor light-emitting device according to a first embodiment of the present disclosure. A semiconductor light-emitting device A1 of the present embodiment includes a support 1, a semiconductor light-emitting element 4, a cover 5, and a sealing resin (not shown).

Figure 1:
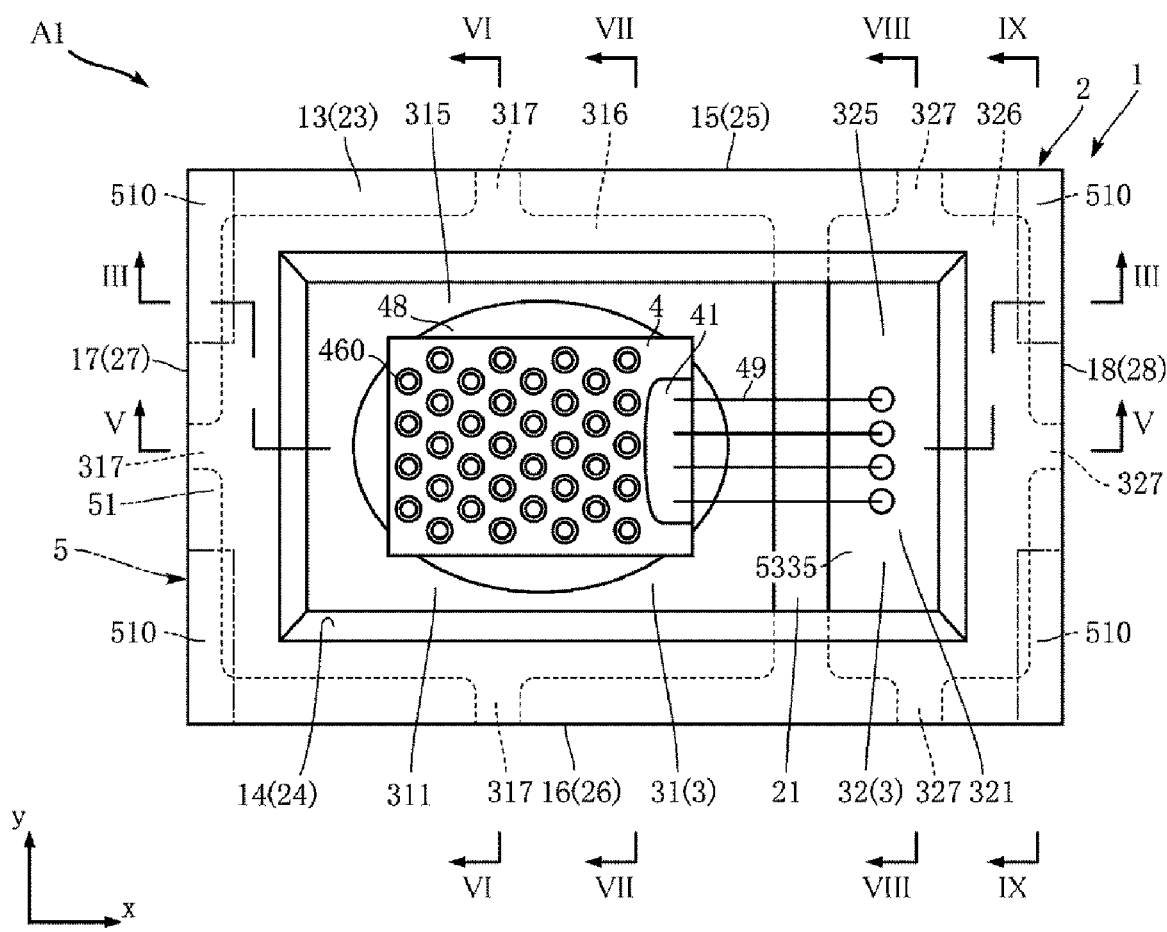
FIG. 1 is a plan view of a principal part illustrating a semiconductor light-emitting device according to a first embodiment of the present disclosure.
Figure 2:
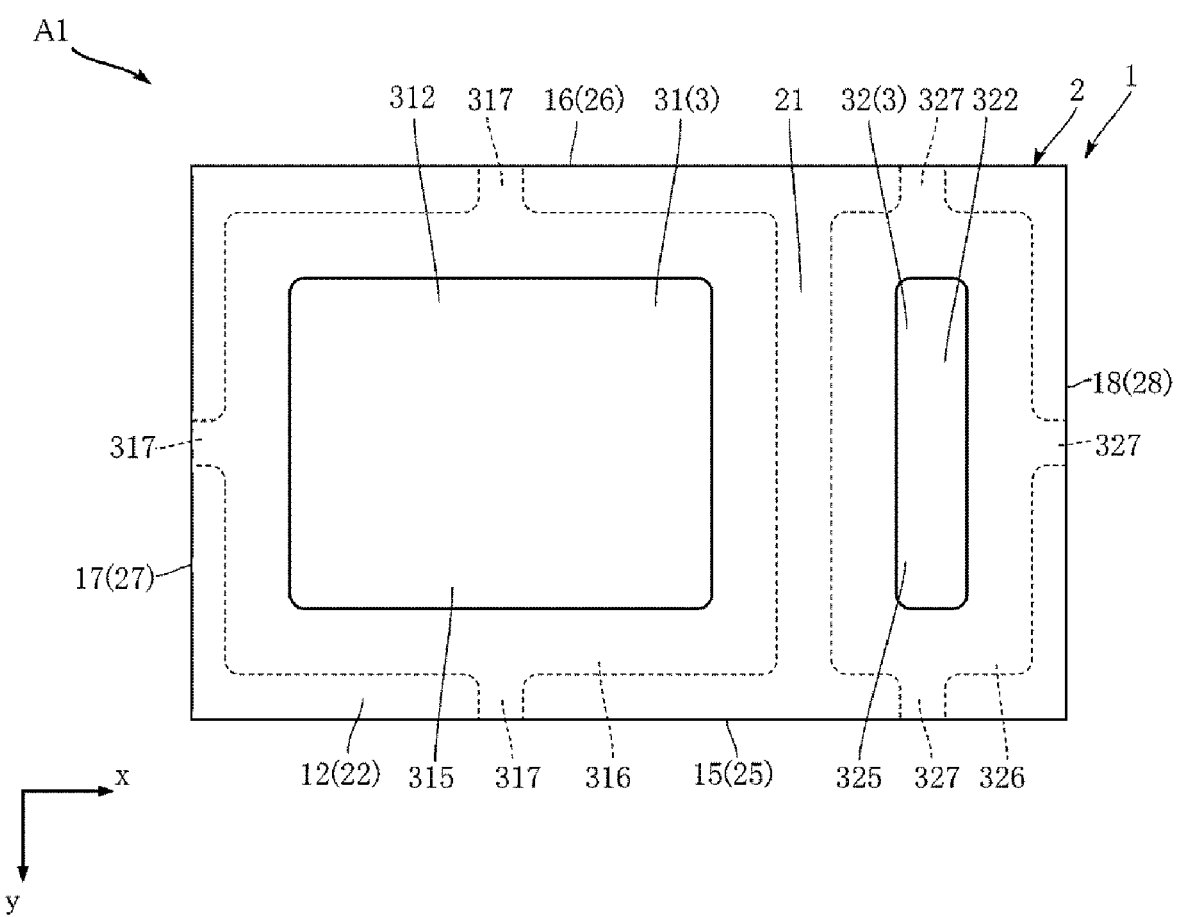
FIG. 2 is a bottom view illustrating the semiconductor light-emitting device according to the first embodiment of the present disclosure.
Figure 3:
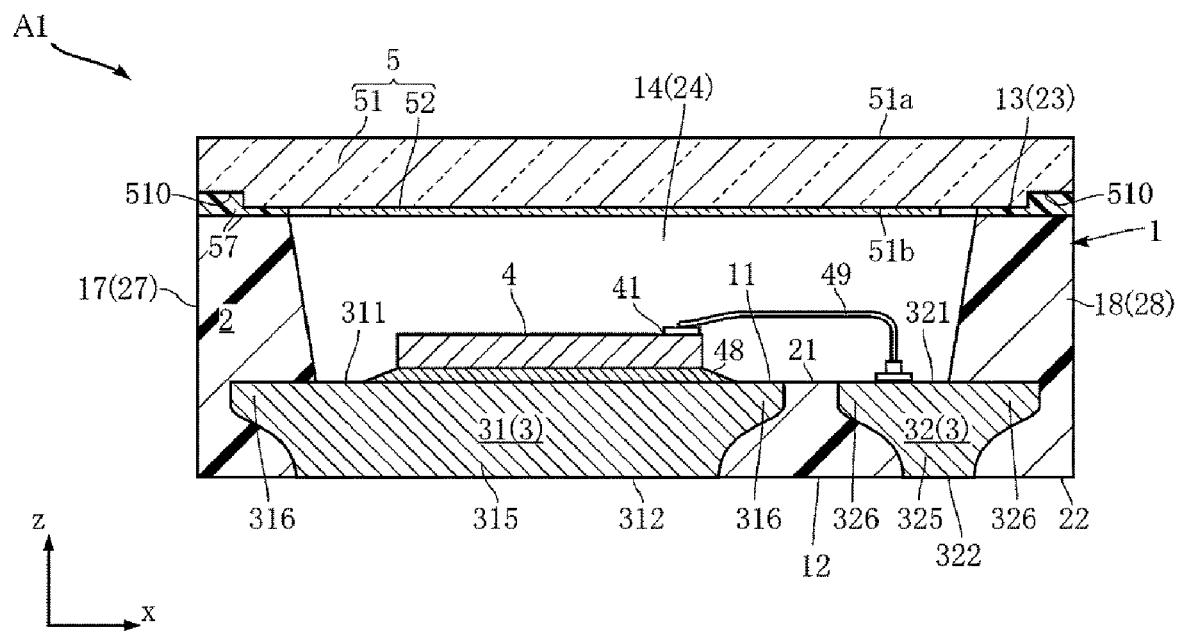
FIG. 3 is a cross-sectional view taken along a line in FIG. 1.
Figure 4:
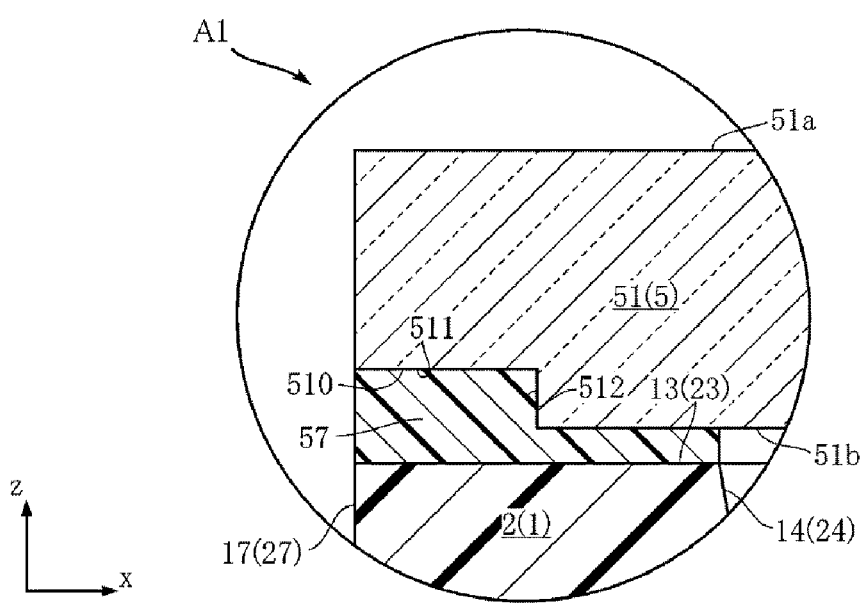
FIG. 4 is an enlarged cross-sectional view of the principal part illustrating the semiconductor light-emitting device according to the first embodiment of the present disclosure.
Figure 5:
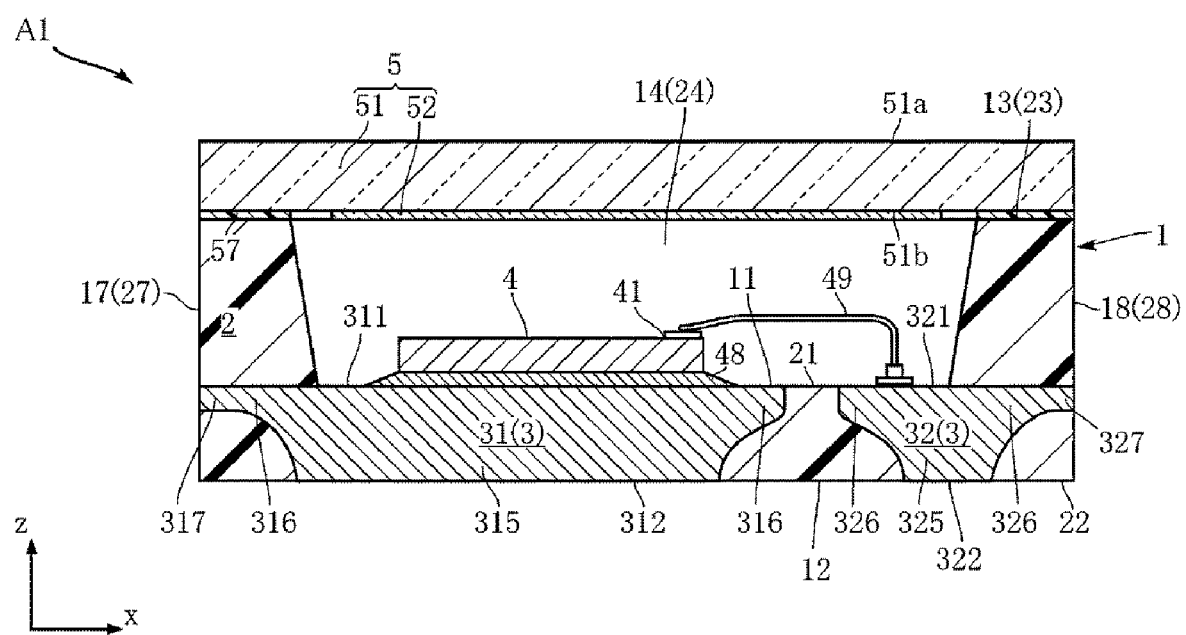
FIG. 5 is a cross-sectional view taken along a line V-V in FIG. 1.
Figure 6:
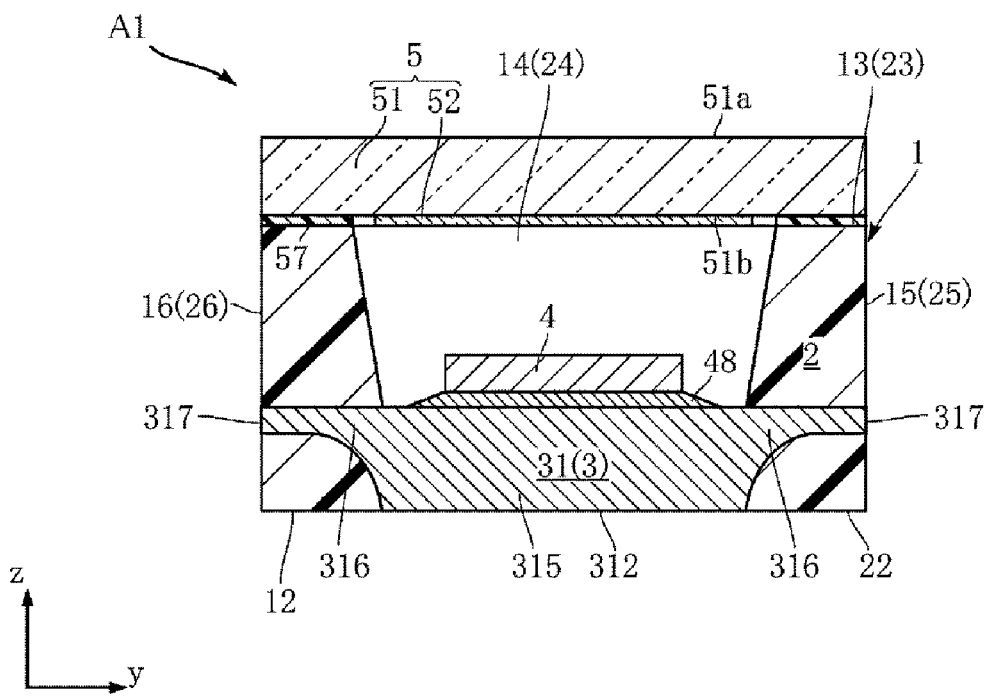
FIG. 6 is a cross-sectional view taken along a line VI-VI in FIG. 1.
Figure 7:
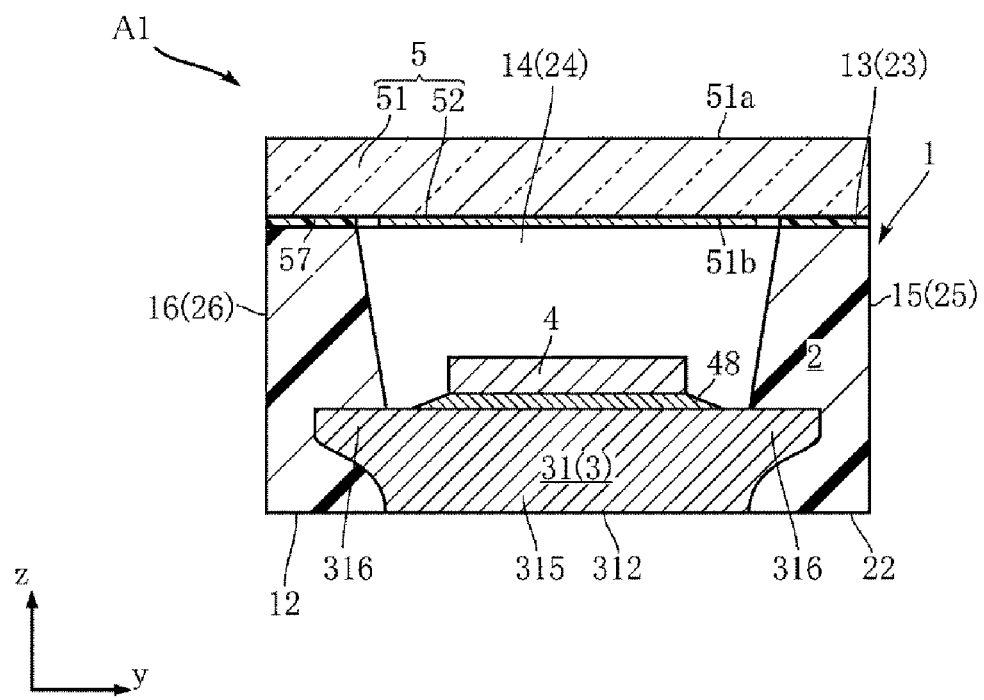
FIG. 7 is a cross-sectional view taken along a line VII-VII in FIG. 1.
Figure 8:
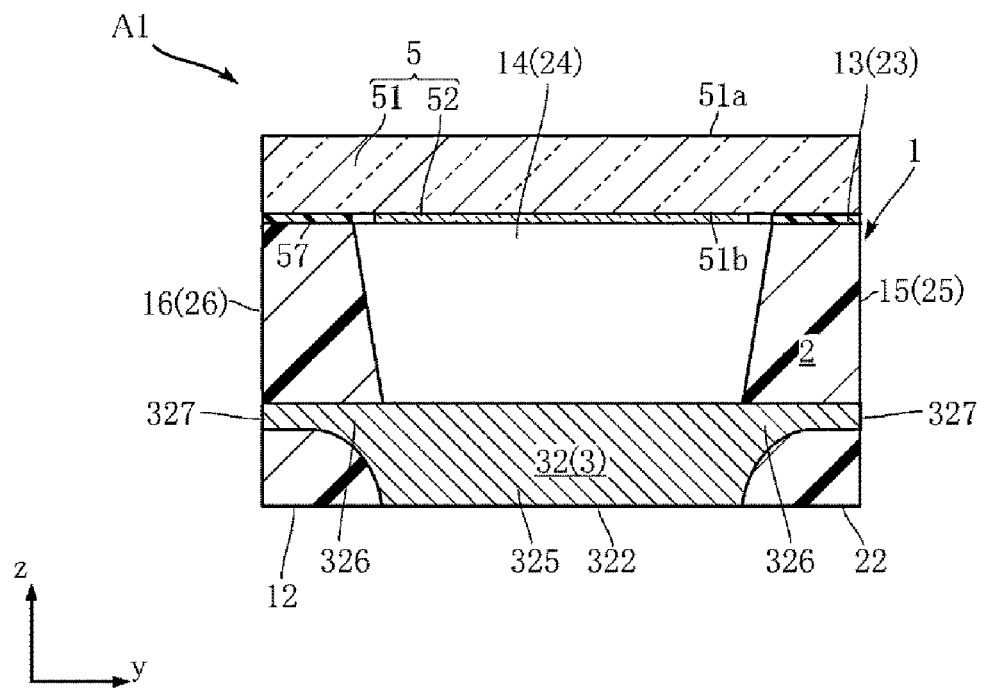
FIG. 8 is a cross-sectional view taken along a line VIII-VIII in FIG. 1.
Figure 9:
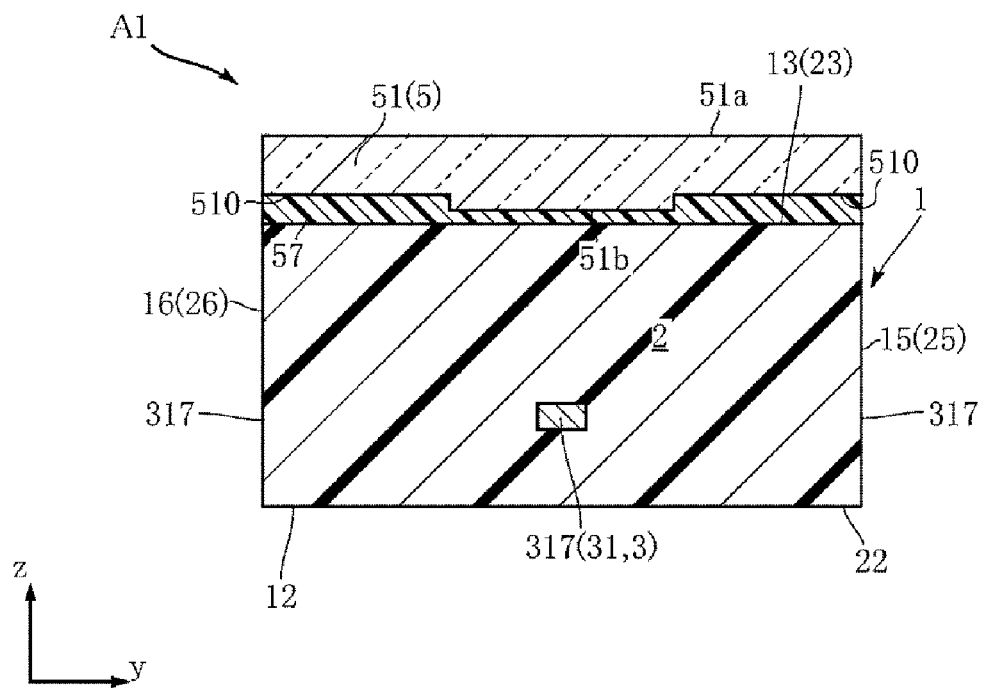
FIG. 9 is a cross-sectional view taken along a line IX-IX in FIG. 1.
Figure 10:
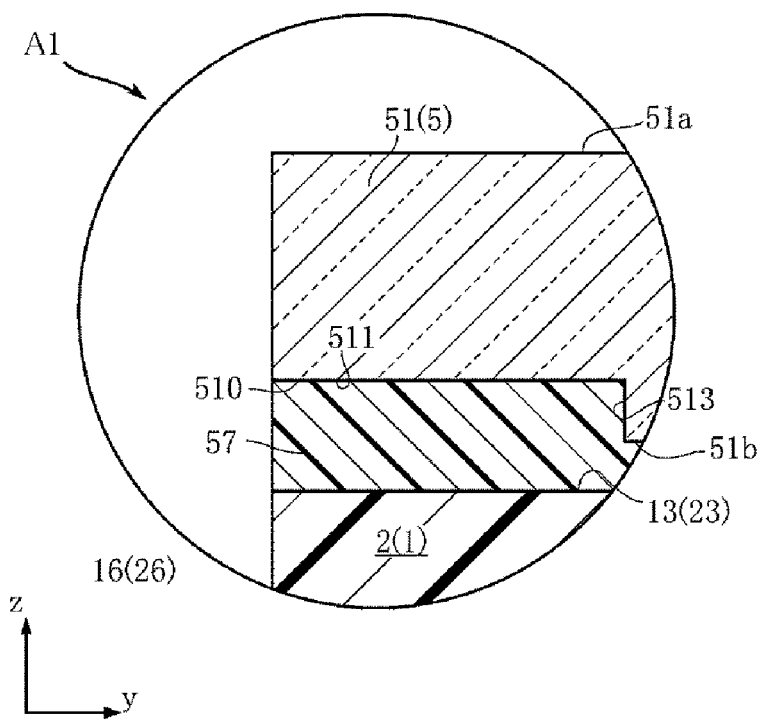
FIG. 10 is an enlarged cross-sectional view of the principal part illustrating the semiconductor light-emitting device according to the first embodiment of the present disclosure.
Figure 11:
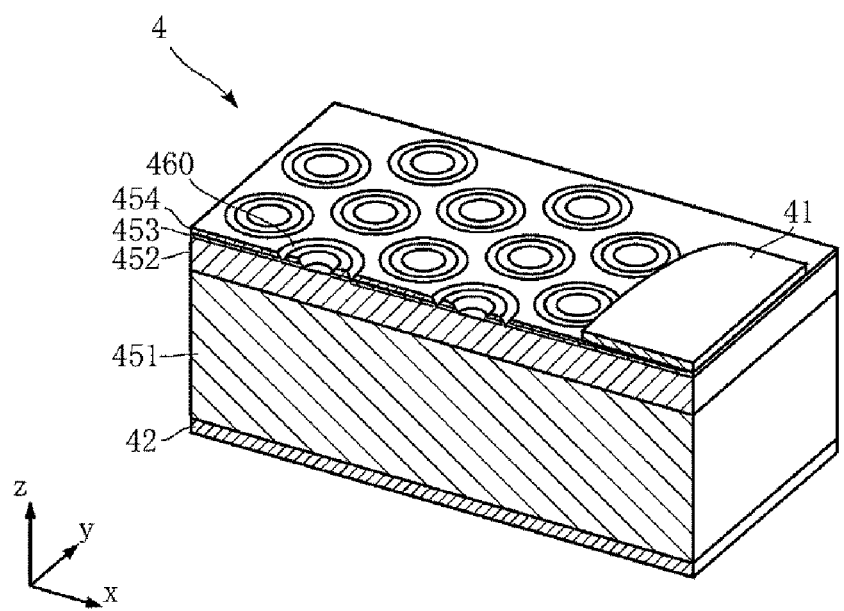
FIG. 11 is an enlarged cross-sectional perspective view illustrating a semiconductor light-emitting element of the semiconductor light-emitting device according to the first embodiment of the present disclosure.
Figure 12:
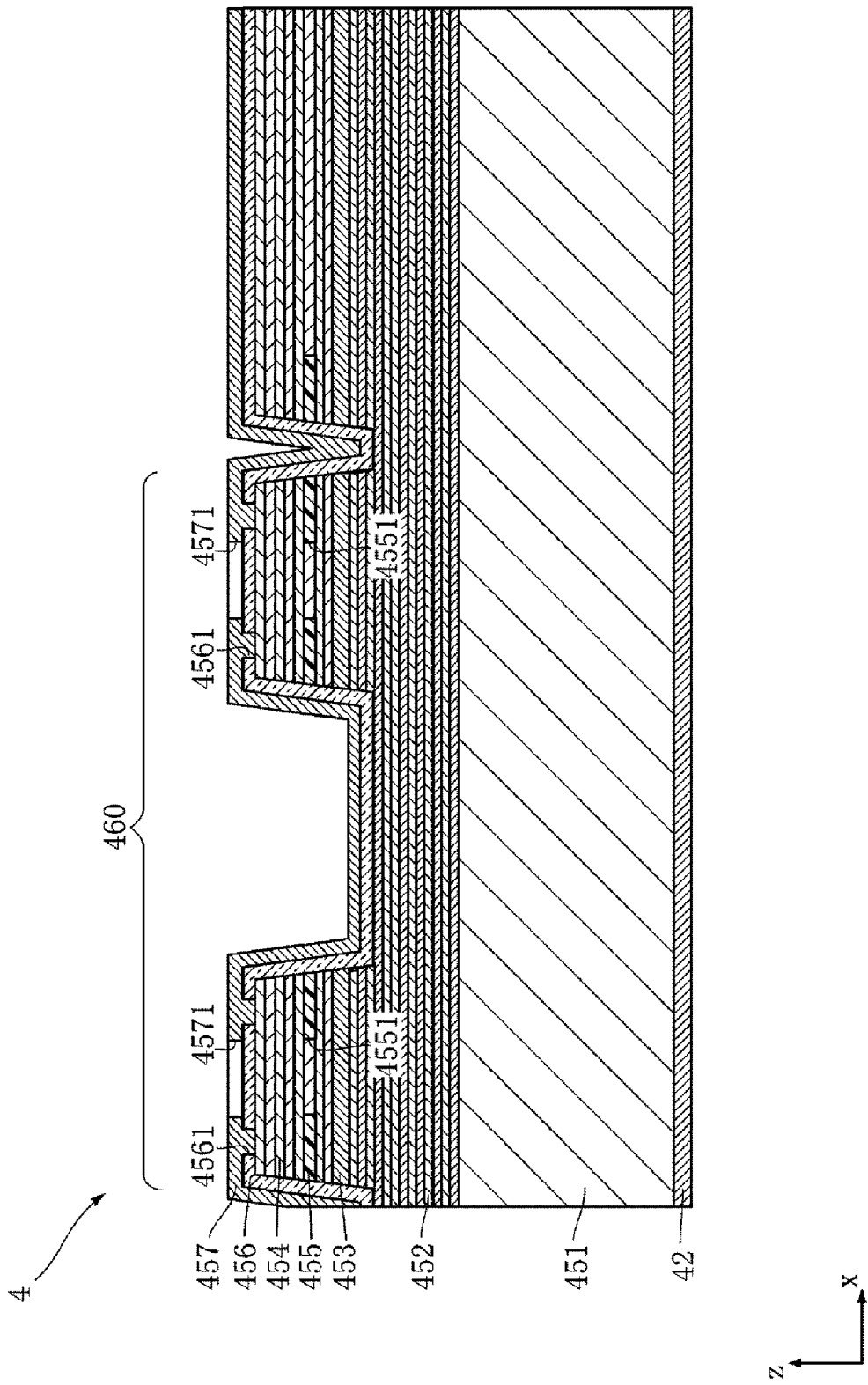
FIG. 12 is an enlarged cross-sectional view of the principal part illustrating the semiconductor light-emitting element of the semiconductor light-emitting device according to the first embodiment of the present disclosure.

FIG. 1 is a plan view of a principal part illustrating the semiconductor light-emitting device A1. FIG. 2 is a bottom view illustrating the semiconductor light-emitting device A1. FIG. 3 is a cross-sectional view taken along a line in FIG. 1. FIG. 4 is an enlarged cross-sectional view of the principal part illustrating the semiconductor light-emitting device A1. FIG. 5 is a cross-sectional view taken along a line V-V in FIG. 1. FIG. 6 is a cross-sectional view taken along a line VI-VI in FIG. 1. FIG. 7 is a cross-sectional view taken along a line VII-VII in FIG. 1. FIG. 8 is a cross-sectional view taken along a line VIII-VIII in FIG. 1. FIG. 9 is a cross-sectional view taken along a line IX-IX in FIG. 1. FIG. 10 is an enlarged cross-sectional view of the principal part illustrating the semiconductor light-emitting device A1. FIG. 11 is an enlarged cross-sectional perspective view illustrating the semiconductor light-emitting element 4 of the semiconductor light-emitting device A1. FIG. 12 is an enlarged cross-sectional view of a principal part illustrating the semiconductor light-emitting element 4 of the semiconductor light-emitting device A1. In these drawings, the z direction corresponds to a first direction of the present disclosure, the y direction corresponds to a second direction of the present disclosure, and the x direction corresponds to a third direction of the present disclosure.

The support 1 of the present embodiment has a first surface 11, a second surface 12, a third surface 13, a fourth surface 14, a fifth surface 15, a sixth surface 16, a seventh surface 17, and an eighth surface 18.

The first surface 11 is a surface facing one side (upper side in the drawing of FIG. 3) in the z direction. The second surface 12 is a surface facing the other side (lower side in the drawing of FIG. 3) opposite to the first surface 11 in the z direction. The third surface 13 is a surface facing one side (upper side in the drawing of FIG. 3) in the z direction like the first surface 11, and is separated from the second surface 12 farther than the first surface 11 is separated from the second surface 12. The fourth surface 14 is interposed between the first surface 11 and the third surface 13, and is connected to the first surface 11 and the third surface 13 in the present embodiment. The fourth surface 14 has an annular shape surrounding the first surface 11 as viewed in the z direction. Further, the fourth surface 14 is inclined such that a distance between opposing parts becomes larger as it goes from the first surface 11 to the third surface 13 in the z direction.

The fifth surface 15 is located between the first surface 11 and the third surface 13 in the z direction, and is a surface facing one side (right side in the drawings of FIGS. 6 to 9) in the y direction. In the illustrated example, the fifth surface 15 is connected to the first surface 11 and the third surface 13. The sixth surface 16 is located between the first surface 11 and the third surface 13 in the z direction, and is a surface facing the other side (left side in the drawings of FIGS. 6 to 9) in the y direction. In the illustrated example, the sixth surface 16 is connected to the first surface 11 and the third surface 13.

The seventh surface 17 is located between the first surface 11 and the third surface 13 in the z direction, and is a surface facing one side (left side in the drawing of FIG. 3) in the x direction. In the illustrated example, the seventh surface 17 is connected to the first surface 11 and the third surface 13. The eighth surface 18 is located between the first surface 11 and the third surface 13 in the z direction, and is a surface facing the other side (the right side in the drawing of FIG. 3) in the x direction. In the illustrated example, the eighth surface 18 is connected to the first surface 11 and the third surface 13.

The configuration of the support 1 is not particularly limited, and in the present embodiment, the support 1 includes a base 2 and a conductive part 3.

The base 2 is made of an insulating material and, for example, an epoxy resin, a silicone resin, or the like is suitably used for the base 2. The base 2 of the present embodiment includes a first surface 21, a second surface 22, a third surface 23, a fourth surface 24, a fifth surface 25, a sixth surface 26, a seventh surface 27, and an eighth surface 28.

The first surface 21 faces one side in the z direction, and constitutes a part of the first surface 11. The second surface 22 faces the other side in the z direction, and constitutes a part of the second surface 12. The third surface 23 faces one side in the z direction, and constitutes the third surface 13. The fourth surface 24 is located between the first surface 21 and the third surface 23 in the z direction, and constitutes the fourth surface 14. The fifth surface 25 faces one side in the y direction, and constitutes the fifth surface 15. The sixth surface 26 faces the other side in the y direction, and constitutes the sixth surface 16. The seventh surface 27 faces one side in the x direction, and constitutes the seventh surface 17. The eighth surface 28 faces the other side in the x direction, and constitutes the eighth surface 18.

The conductive part 3 constitutes a conduction path between the semiconductor light-emitting element 4 and the outside of the semiconductor light-emitting device A1, and includes a first lead 31 and a second lead 32 in the present embodiment. The first lead 31 and the second lead 32 are made of, for example, metal such as Cu, Fe, Ni or the like.

The first lead 31 includes a first surface 311, a second surface 312, a main part 315, an edge part 316, and a plurality of extension parts 317. The first surface 311 is a surface facing one side in the z direction, and constitutes a part of the first surface 11. A part of the first surface 311 is exposed to a region surrounded by the fourth surface 14 as viewed in the z direction. The second surface 312 is a surface facing the other side opposite to the first surface 311 in the z direction, and constitutes a part of the second surface 12. In the illustrated example, the second surface 312 is smaller than the first surface 311 as viewed in the z direction, and is included in the first surface 311.

The main part 315 is a part including the first surface 311 and the second surface 312, and is a part where both the first surface 311 and the second surface 312 overlap as viewed in the z direction. The edge part 316 is a part surrounding the main part 315 as viewed in the z direction, and includes a part of the first surface 311. The other side portion of the edge part 316 in the z direction is covered with the base 2. The plurality of extension parts 317 extend outward from the edge part 316 as viewed in the z direction. Each of the extension parts 317 has a part of the first surface 311. The other side portions of the extension parts 317 in the z direction are covered with the base 2. In the illustrated example, the first lead 31 has three extension parts 317. One extension part 317 reaches the fifth surface 25 of the base 2, and an end surface thereof is flush with the fifth surface 25 and is exposed from the fifth surface 25. Another extension part 317 reaches the sixth surface 26 of the base 2, and an end surface thereof is flush with the sixth surface 26 and is exposed from the sixth surface 26. Still another extension part 317 reaches the seventh surface 27 of the base 2, and an end surface thereof is flush with the seventh surface 27 and is exposed from the seventh surface 27.

The second lead 32 is arranged away from the first lead 31 on the other side in the x direction. The second lead 32 includes a first surface 321, a second surface 322, a main part 325, an edge part 326, and a plurality of extension parts 327. The first surface 321 is a surface facing one side in the z direction, and constitutes a part of the first surface 11. A part of the first surface 321 is exposed to a region surrounded by the fourth surface 14 as viewed in the z direction. The second surface 322 is a surface facing the other side opposite to the first surface 321 in the z direction, and constitutes a part of the second surface 12. In the illustrated example, the second surface 322 is smaller than the first surface 321 as viewed in the z direction, and is included in the first surface 321.

The main part 325 is a part including the first surface 321 and the second surface 322, and is a part where both the first surface 321 and the second surface 322 overlap as viewed in the z direction. The edge part 326 is a part surrounding the main part 325 as viewed in the z direction, and includes a part of the first surface 321. The other side portion of the edge part 326 in the z direction is covered with the base 2. The plurality of extension parts 327 extend outward from the edge part 326 as viewed in the z direction. Each of the extension parts 327 has a part of the first surface 321. The other side portions of the extension parts 327 in the z direction are covered with the base 2. In the illustrated example, the second lead 32 has three extension parts 327. One extension part 327 reaches the fifth surface 25 of the base 2, and an end surface thereof is flush with the fifth surface 25 and is exposed from the fifth surface 25. Another extension part 327 reaches the sixth surface 26 of the base 2, and an end surface thereof is flush with the sixth surface 26 and is exposed from the sixth surface 26. Still another extension part 327 reaches the eighth surface 28 of the base 2, and an end surface thereof is flush with the eighth surface 28 and is exposed from the eighth surface 28.

The semiconductor light-emitting element 4 is a light source in the semiconductor light-emitting device A1 and emits light of a predetermined wavelength band. The specific configuration of the semiconductor light-emitting element 4 is not particularly limited, and is a semiconductor laser element, an LED element, or the like. In the present embodiment, the semiconductor light-emitting element 4 is a semiconductor laser element, and a VCSEL element is used. The semiconductor light-emitting element 4 is die-bonded to the first surface 311 (first surface 11) of the first lead 31 of the conductive part 3 by a conductive bonding material 48. The conductive bonding material 48 is, for example, Ag paste or solder. The light from the semiconductor light-emitting element 4 is generally emitted to one side in the z direction.

As illustrated in FIG. 1, the semiconductor light-emitting element 4 is provided with a first electrode 41 and a plurality of light-emitting regions 460 in a plan view. The plurality of light-emitting regions 460 are discretely arranged in a region other than the first electrode 41 of the semiconductor light-emitting element 4 in the plan view.

As illustrated in FIGS. 11 and 12, the semiconductor light-emitting element 4 of this example includes the first electrode 41, a second electrode 42, a second substrate 451, a fourth semiconductor layer 452, an active layer 453, a fifth semiconductor layer 454, a current constriction layer 455, an insulating layer 456, and a conductive layer 457, on which the plurality of light-emitting regions 460 are formed. Furthermore, the configuration example illustrated in the same drawings is an example of the VCSEL element as the semiconductor light-emitting element 4, and is not limited to this configuration. FIG. 12 illustrates an enlarged part including one light-emitting region 460.

The second substrate 451 is made of a semiconductor. The semiconductor constituting the second substrate 451 is, for example, n-type GaAs. The semiconductor constituting the second substrate 451 may be other than GaAs.

The active layer 453 is made of a compound semiconductor that emits light having a wavelength of, for example, 980 nm band (hereinafter, referred to as "λa") by spontaneous emission and stimulated emission. The active layer 453 is located between the fourth semiconductor layer 452 and the fifth semiconductor layer 454. In the present embodiment, the active layer 453 is configured by a multiple quantum well structure in which undoped GaAs well layers and undoped AlGaAs barrier layers (barrier layers) are alternately stacked. For example, undoped $Al_{0.35}Ga_{0.65}As$ barrier layers and undoped GaAs well layers are alternately and repeatedly formed in 2 to 6 cycles.

The fourth semiconductor layer 452 is typically a distributed bragg reflector (DBR) layer and is formed on the second substrate 451. The fourth semiconductor layer 452 is made of a semiconductor having a first conductivity type. In this example, the first conductivity type is n-type. The fourth semiconductor layer 452 is configured as a DBR for efficiently reflecting the light emitted from the active layer 453. The fourth semiconductor layer 452 is configured by overlapping a plurality of pairs of two layers, each of which is an AlGaAs layer having a thickness of λa/4 and has a different reflectivity. More specifically, the fourth semiconductor layer 452 is configured by stacking an n-type $Al_{0.16}Ga_{0.84}As$ layer (a layer of low Al composition) having, for example, a thickness of 600 Å and a relatively low Al composition and an n-type $Al_{0.92}Ga_{0.16}As$ layer (a layer of high Al composition) having, for example, a thickness of 700 Å and a relatively high Al composition, alternately and repeatedly in multiple cycles (e.g., 20 cycles). The n-type $Al_{0.16}Ga_{0.84}As$ layers and the n-type $Al_{0.92}Ga_{0.16}As$ layers are doped with an n-type impurity (e.g., Si) at concentrations of, for example, $2 \times 10^{17}$ $cm^{-3}$ to $3 \times 10^{18}$ $cm^{-3}$ and $2 \times 10^{17}$ $cm^{-3}$ to $3 \times 10^{18}$ $cm^{-3}$, respectively.

The fifth semiconductor layer 454 is typically a DBR layer and is made of a semiconductor having a second conductivity type. In this example, the second conductivity type is p-type. Unlike the present embodiment, the first conductivity type may be p-type and the second conductivity type may be n-type. The fourth semiconductor layer 452 is located between the fifth semiconductor layer 454 and the second substrate 451. The fifth semiconductor layer 454 is configured as a DBR for efficiently reflecting the light emitted from the active layer 453. More specifically, the fifth semiconductor layer 454 is configured by overlapping a plurality of pairs of two layers, each of which is an AlGaAs layer having a thickness of λa/4 and has a different reflectivity. The fifth semiconductor layer 454 is configured by stacking a p-type $Al_{0.10}Ga_{0.84}As$ layer (a layer of low Al composition) having, for example, a relatively low Al composition, and a p-type $Al_{0.02}Ga_{0.10}As$ layer (a layer of high Al composition) having a relatively high Al composition, alternately and repeatedly in multiple cycles (e.g., 20 cycles).

The current constriction layer 455 is located in the fifth semiconductor layer 454. The current constriction layer 455 is made of, for example, a layer which contains a large amount of Al and is thus easily oxidizable. The current constriction layer 455 is formed by oxidizing this easily-oxidizable layer. The current constriction layer 455 is not necessarily formed by oxidation, and may be formed by other methods (for example, ion implantation). Openings 4551 are formed in the current constriction layer 455. A current flows through the openings 4551.

The insulating layer 456 is formed on the fifth semiconductor layer 454. The insulating layer 456 is made of, for example, $SiO_2$. Openings 4561 are formed in the insulating layer 456.

The conductive layer 457 is formed on the insulating layer 456. The conductive layer 457 is made of a conductive material (e.g., metal). The conductive layer 457 is electrically connected to the fifth conductive layer 354 through the openings 4561 of the insulating layer 456. The conductive layer 457 has openings 4571.

The light-emitting region 460 is a region where the light from the active layer 453 is emitted directly or after reflection. In this example, the light-emitting region 460 has an annular shape in the plan view, but its shape is not particularly limited. In the light-emitting region 460, the fifth semiconductor layer 454, the current constriction layer 455, the insulating layer 456, and the conductive layer 457 described above are stacked, and the openings 4551 of the current constriction layer 455, the openings 4561 of the insulating layer 456, the openings 4571 of the conductive layer 457, and the like are formed therein. In the light-emitting region 460, the light from the active layer 453 is emitted through the openings 4571 of the conductive layer 457.

The first electrode 41 is made of, for example, metal, and is electrically connected to the fifth semiconductor layer 454. The second electrode 42 is formed on the rear surface of the second substrate 451 and is made of, for example, metal. The second electrode 42 is die-bonded to the first surface 311 by, for example, a conductive bonding material 48 such as a paste or solder containing metal such as Ag or the like. Thus, the second electrode 42 is electrically connected to the first lead 31 of the conductive part 3.

Wires 49 are connected to the first electrode 41 of the semiconductor light-emitting element 4 and the first surface 321 of the second lead 32, as illustrated in FIGS. 1 and 3. The material of the wires 49 is not particularly limited, and they are made of, for example, Au. In the present embodiment, four wires 49 are installed in parallel with each other. However, the number and arrangement of the wires 49 are not particularly limited.

The cover 5 is configured to close the semiconductor light-emitting element 4 as viewed in the z direction and transmit light from the semiconductor light-emitting element 4. In the present embodiment, the cover 5 includes a base layer 51 and a diffusion layer 52. The cover 5 is bonded to the third surface 13 (third surface 23) of the support 1 by, for example, a bonding material 57. The bonding material 57 is an insulating adhesive made of, for example, a resin material.

The base layer 51 is made of a material that transmits the light from the semiconductor light-emitting element 4 such as glass or the like. In the present embodiment, the base layer 51 is made of transparent glass. The shape or the like of the base layer 51 is not particularly limited, and in the present embodiment, it is a rectangular shape.

The base layer 51 includes a front surface 51a and a rear surface 51b. The front surface 51a and the rear surface 51b face opposite sides to each other in the z direction. As illustrated in FIG. 3, the front surface 51a faces one side (upper side in FIG. 3) in the z direction. The rear surface 51b faces the other side (lower side in the drawing in FIG. 3) in the z direction and faces the semiconductor light-emitting element 4. The front surface 51a and the rear surface 51b are flat surfaces. In the illustrated example, the front surface 51a has a size that corresponds to the entire base layer 51 as viewed in the z direction. The rear surface 51b is retreated inward of an outer edge of the base layer 51 as viewed in the z direction. The rear surface 51b is smaller than the upper end edge of the fourth surface 14 (fourth surface 24) as viewed in the z direction, and is included in the upper end edge.

The base layer 51 has undulation parts 510. The undulation parts 510 are parts supported by the support 1 by the bonding material 57 and are more uneven than the rear surface 51b. Furthermore, in the present disclosure, when the "undulation parts 510 are more uneven than the rear surface 51b", it includes, for example, a case where each of the undulation parts 510 includes portions recessed in the z direction or portions protruding in the z direction and the rear surface 51b is a flat surface, and a case where each of the undulation parts 510 has a shape with a plurality of fine irregularities and has a rough surface having a large surface roughness while the rear surface 51b has a relatively small surface roughness, and the like.

As illustrated in FIGS. 3, 4, 9, and 10, the undulation part 510 of the present embodiment includes a first surface 511. The first surface 511 faces the same side as the rear surface 51b in the z direction, and is located closer to the front surface 51a than the rear surface 51b in the z direction. The shape of the undulation part 510 is not particularly limited, and is, for example, a rectangular shape.

In the illustrated example, the undulation part 510 has a second surface 512 and a third surface 513. As illustrated in FIG. 4, the second surface 512 is located between the rear surface 51b and the first surface 511 in the z direction, and in the illustrated example, it connects the rear surface 51b and the first surface 511. The second surface 512 faces the x direction, and in the illustrated example, it faces the outside in the x direction. Furthermore, the undulation part 510 of the present embodiment is opened to the outside in the x direction.

As illustrated in FIG. 10, the third surface 513 is located between the rear surface 51b and the first surface 511 in the z direction, and in the illustrated example, it connects the rear surface 51b and the first surface 511. The third surface 513 faces the y direction, and in the illustrated example, it faces the outside in the y direction. Furthermore, the undulation part 510 of the present embodiment is opened to the outside in the y direction.

As illustrated in FIG. 1, the undulation part 510 overlaps the third surface 23 (third surface 13) in the z direction. In the illustrated example, the entire undulation part 510 overlaps the third surface 23 (third surface 13). Furthermore, in the illustrated example, the bonding material 57 fills the undulation part 510 and is formed in a region overlapping the third surface 13 (third surface 23) as viewed in the z direction. However, for example, a part of the bonding material 57 may be in contact with the fourth surface 14 (fourth surface 24).

The number of the undulation parts 510 is not particularly limited. In the illustrated example, the base layer 51 includes four undulation parts 510. The four undulation parts 510 include two undulation parts 510 that are separated from each other in the x direction. In addition, the four undulation parts 510 include two undulation parts 510 that are separated from each other in the y direction. In the illustrated example, the four undulation parts 510 are arranged at the four corners of the base layer 51 as viewed in the z direction.

The diffusion layer 52 is disposed on the base layer 51 and is a layer that transmits the light from the semiconductor light-emitting element 4 while diffusing the light. An epoxy resin layer, on which optical treatment that realizes a diffusion function has been performed, may be used as the diffusion layer 52. In the present embodiment, as illustrated in FIGS. 3 and 6, the diffusion layer 52 is installed in at least a part of the rear surface 51b facing the semiconductor light-emitting element 4. In addition, unlike the present embodiment, the diffusion layer 52 may be installed on the front surface 51a of the base layer 51.

Next, an operation of the semiconductor light-emitting device A1 will be described.

According to the present embodiment, the cover 5 is fixed to the support 1 by bonding the undulation part 510 of the base layer 51 to the support 1 by the bonding material 57. The undulation part 510 is a part which is more uneven than the rear surface 51b. Therefore, a contact surface between the undulation part 510 and the bonding material 57 is not limited to, for example, a flat surface perpendicular to the z direction, but has a shape with undulations in the z direction. Thus, it is possible to improve a bonding strength between the base layer 51 and the support 1, and to suppress detachment of the cover 5.

The undulation part 510 of the present embodiment includes the first surface 511 located on the side of the front surface 51a in the z direction with respect to the rear surface 51b, and is formed as a so-called recess. Accordingly, the bonding material 57 has such a shape that the bonding material digs into the base layer 51 in the z direction. This may improve the bonding strength by the bonding material 57 and suppress the detachment of the cover 5 in some embodiments.

The undulation part 510 includes the second surface 512 and the third surface 513. Therefore, when a shearing force that shifts the cover 5 to the support 1 in the x direction or the y direction is applied, it is possible to further improve its holding capacity by the bonding material 57. This is suitable for suppressing the detachment of the cover 5.

The base layer 51 of the present embodiment has the four undulation parts 510 arranged at the four corners. For example, the detachment of the rectangular cover 5 is likely to occur from any of the four corners. According to the present embodiment, it is possible to more reliably suppress the detachment of the cover 5 from the four corners.

Since the semiconductor light-emitting element 4 is mounted on the first lead 31, heat at the time of light emission of the semiconductor light-emitting element 4 may be released from the second surface 312 of the first lead 31 to the outside.

FIG. 13 to FIG. 25 illustrate modifications and other embodiments of the present disclosure. In these drawings, the same or similar elements as those in the aforementioned embodiment are denoted by the same reference numerals as those in the aforementioned embodiment.

First Modification to First Embodiment

Figure 13:
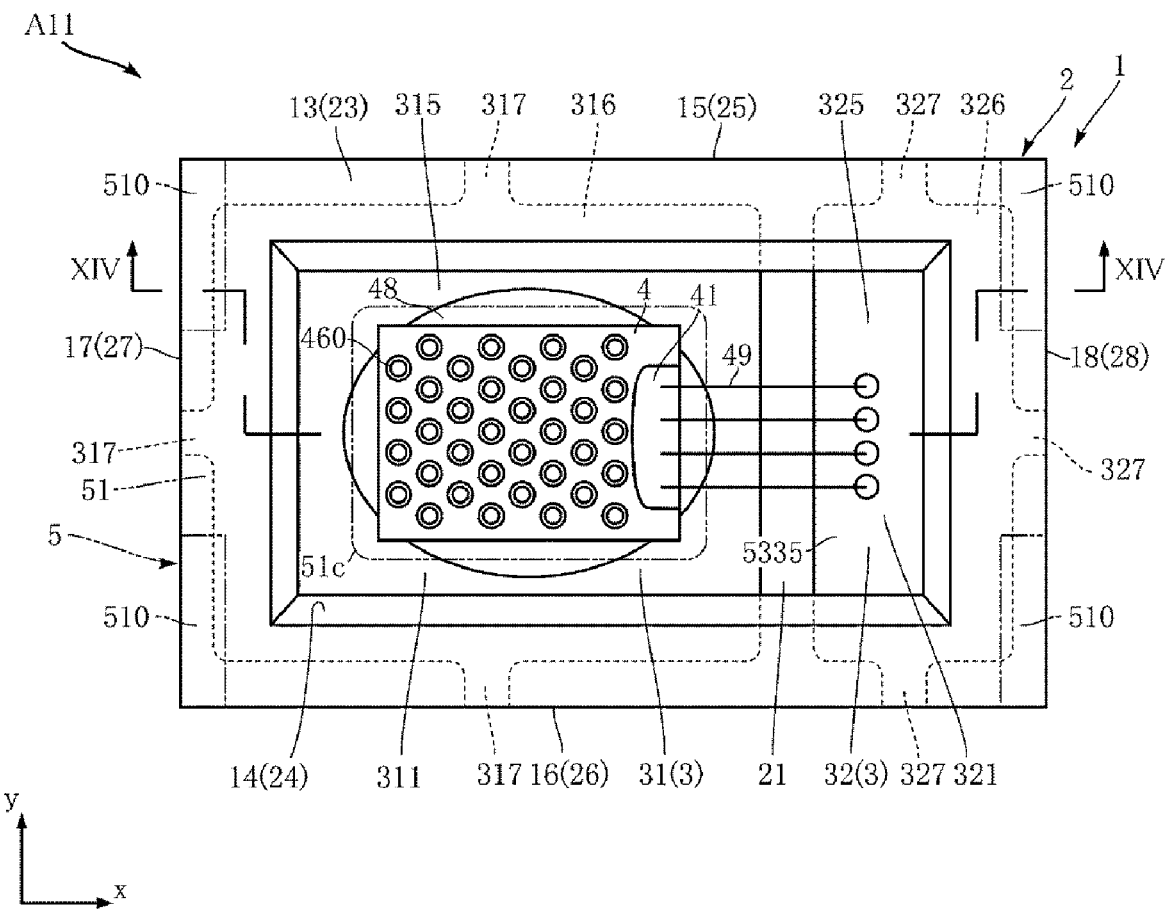
FIG. 13 is a plan view of a principal part illustrating a first modification of the semiconductor light-emitting device according to the first embodiment of the present disclosure.
Figure 14:
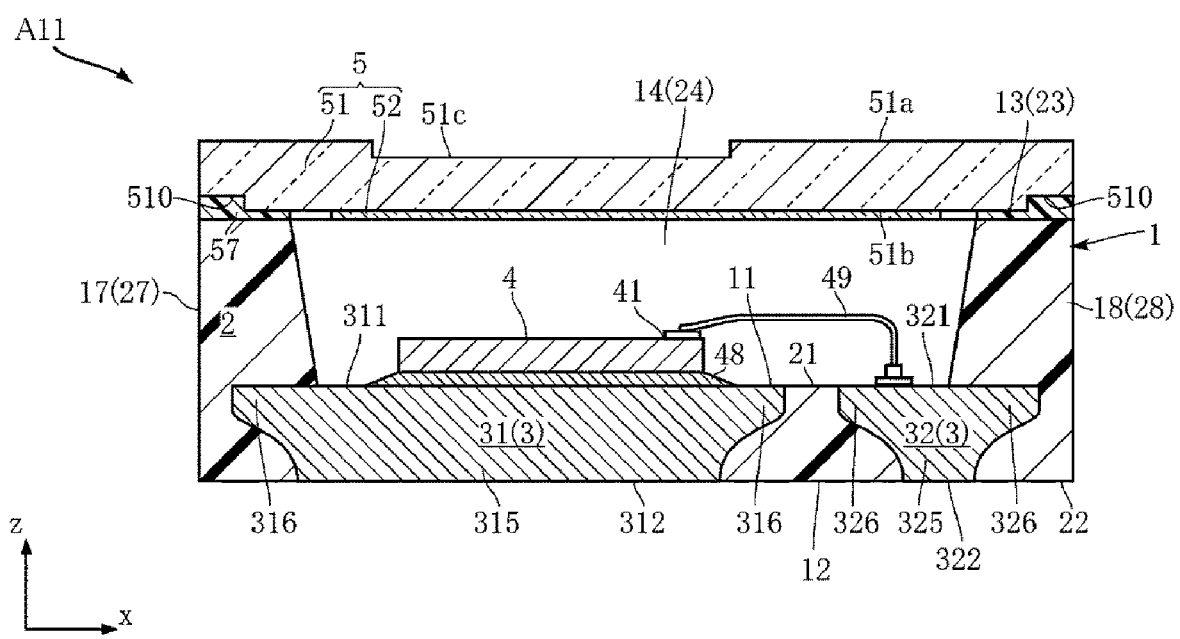
FIG. 14 is a cross-sectional view taken along a line XIV-XIV in FIG. 13.

FIGS. 13 and 14 illustrate a first modification of the semiconductor light-emitting device A1. In a semiconductor light-emitting device A11 of this example, a retreat surface 51c is installed in the base layer 51.

The retreat surface 51c faces the same side as the front surface 51a in the z direction, and is located closer to the rear surface 51b than the front surface 51a in the z direction. In other words, the retreat surface 51c is retreated from the front surface 51a to the rear surface 51b side in the z direction.

The retreat surface 51c is a flat surface. Furthermore, the retreat surface 51c overlaps the semiconductor light-emitting element 4 as viewed in the z direction, and in the illustrated example, it overlaps the entire semiconductor light-emitting element 4.

The detachment of the cover 5 may also be suppressed by the semiconductor light-emitting device A11 of the present example. Furthermore, in this modification, the retreat surface 51c that overlaps the semiconductor light-emitting element 4 as viewed in the z direction is retreated from the surface 51a in the z direction. Thus, it is possible to prevent the retreat surface 51c from being damaged when the semiconductor light-emitting device A11 is manufactured, transported, mounted, and used. This may increase the light amount of the semiconductor light-emitting device A1 in some embodiments. Furthermore, in the following modifications and embodiments, a configuration including the retreat surface 51c may be appropriately employed.

Second Modification to First Embodiment

Figure 15:
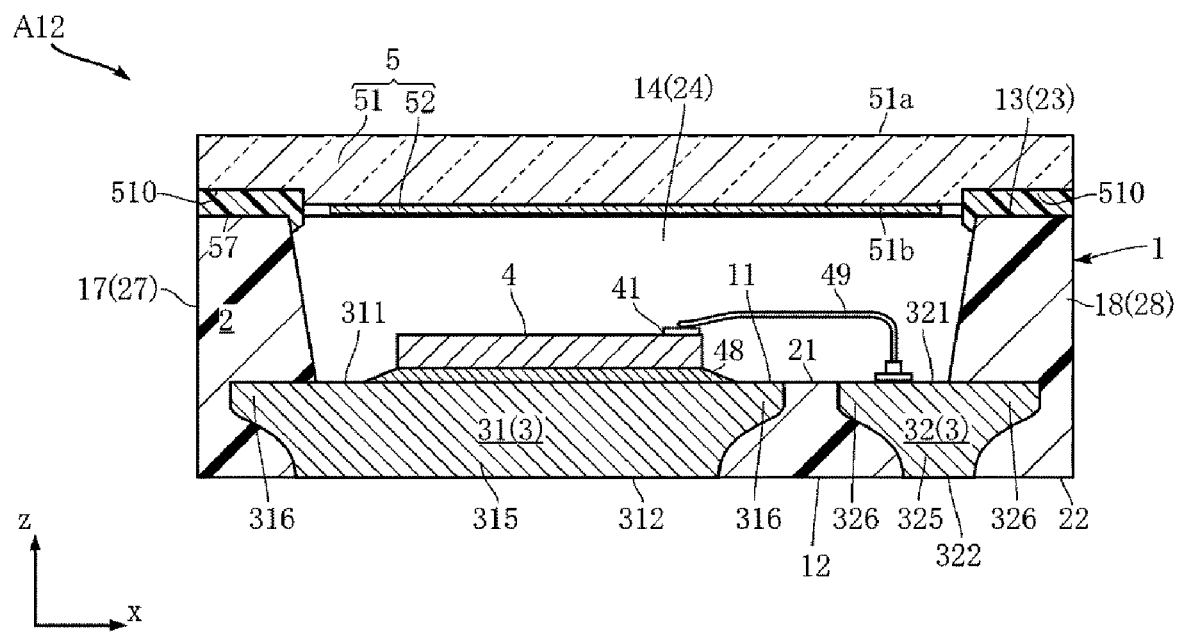
FIG. 15 is a cross-sectional view illustrating a second modification of the semiconductor light-emitting device according to the first embodiment of the present disclosure.
Figure 16:
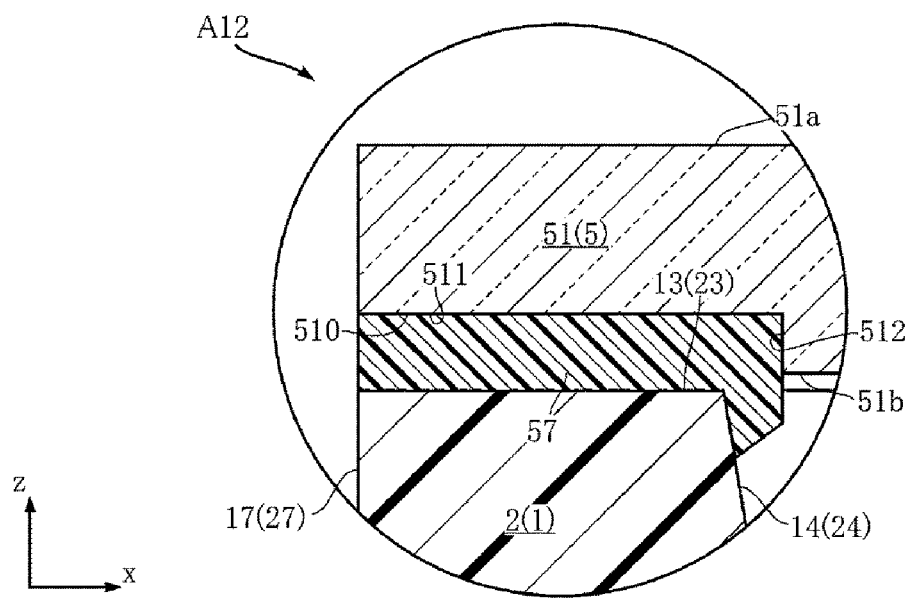
FIG. 16 is an enlarged cross-sectional view of a principal part illustrating the second modification of the semiconductor light-emitting device according to the first embodiment of the present disclosure.

FIGS. 15 and 16 illustrate a second modification of the semiconductor light-emitting device A1. In a semiconductor light-emitting device A12 of this example, a relationship between the undulation part 510 and the third surface 13 (third surface 23) is different from that of the example described above.

In this example, the undulation part 510 extends inward from the third surface 13 (third surface 23) as viewed in the z direction, and overlaps the fourth surface 14 (fourth surface 24). In addition, the bonding material 57 fills the undulation part 510 and is in contact with a part of the fourth surface 14 (fourth surface 24). The detachment of the cover 5 can also be suppressed by the semiconductor light-emitting device A12.

Third Modification to First Embodiment

Figure 17:
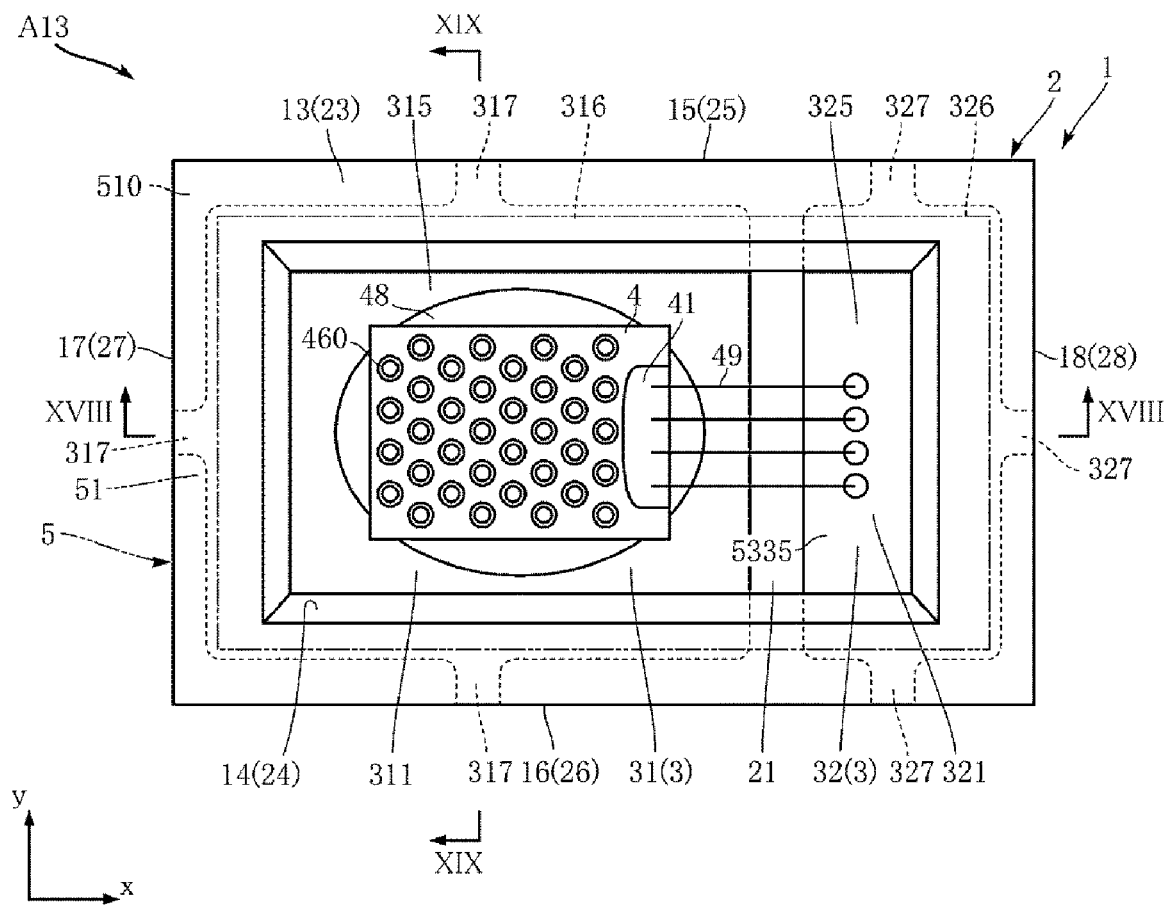
FIG. 17 is a plan view of a principal part illustrating a third modification of the semiconductor light-emitting device according to the first embodiment of the present disclosure.
Figure 18:
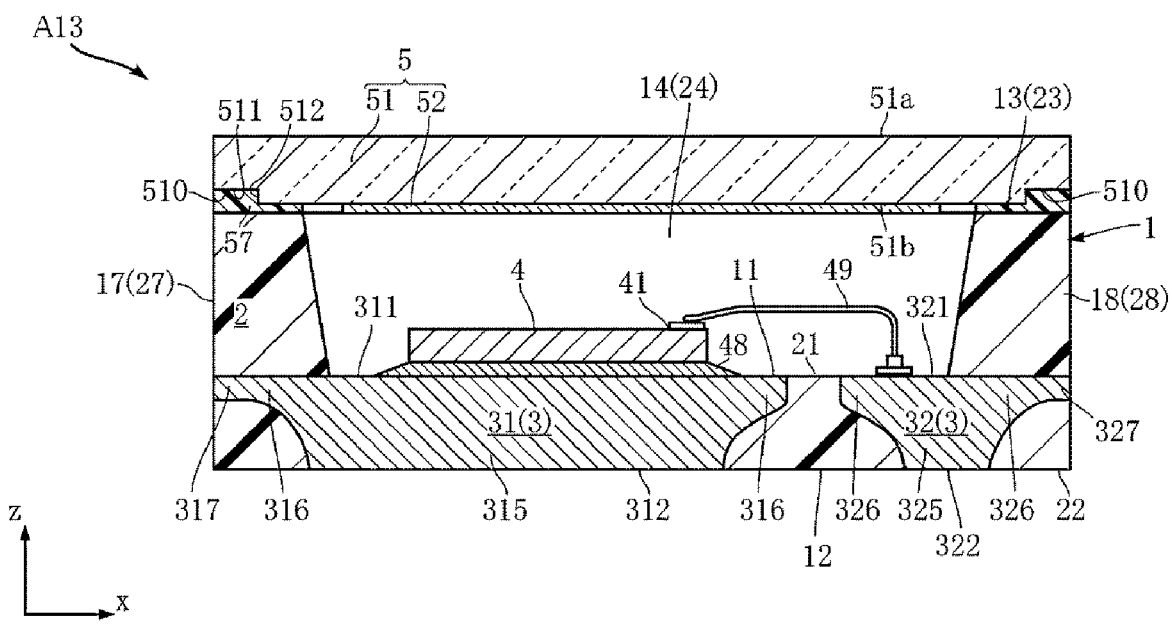
FIG. 18 is a cross-sectional view taken along a line XVIII-XVIII in FIG. 17.
Figure 19:
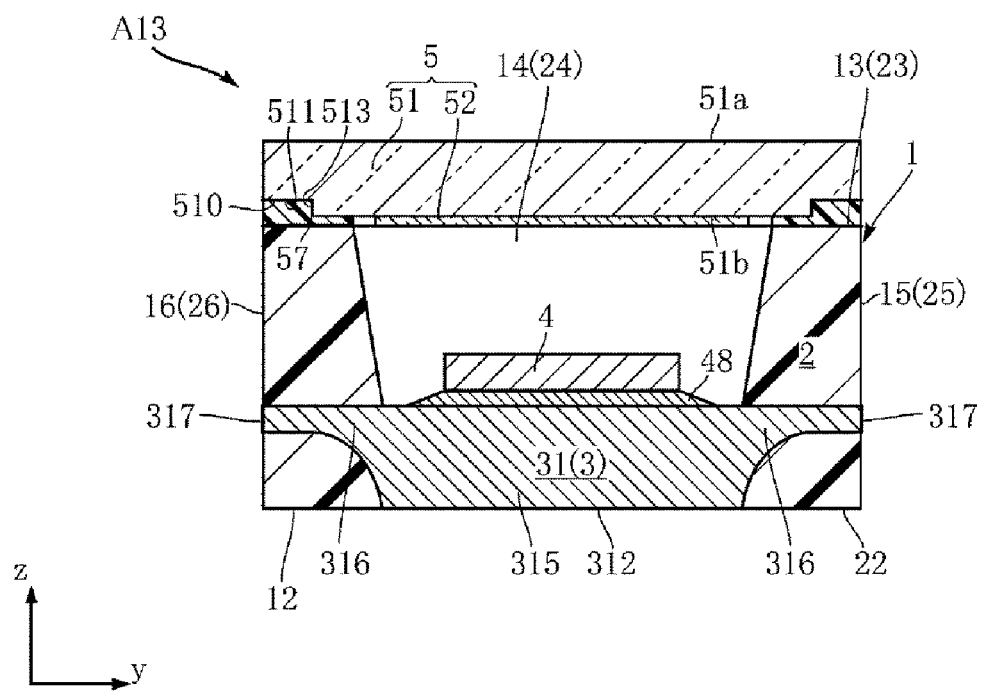
FIG. 19 is a cross-sectional view taken along a line XIX-XIX in FIG. 17.

FIGS. 17 to 18 illustrate a third modification of the semiconductor light-emitting device A1. In a semiconductor light-emitting device A13 of this example, a shape of the undulation part 510 is different from that of the example described above.

In this example, the undulation part 510 has an annular shape surrounding the rear surface 51b as viewed in the z direction. The undulation part 510 is formed along the outer edge of the base layer 51 as viewed in the z direction. Also in this example, the undulation part 510 includes the first surface 511, the two second surfaces 512, and the two third surfaces 513. The detachment of the cover 5 can also be suppressed by the semiconductor light-emitting device A13. A specific configuration of the undulation part 510 may also be the configuration of the undulation part 510 of the semiconductor light-emitting device A12 described above.

Second Embodiment

Figure 20:
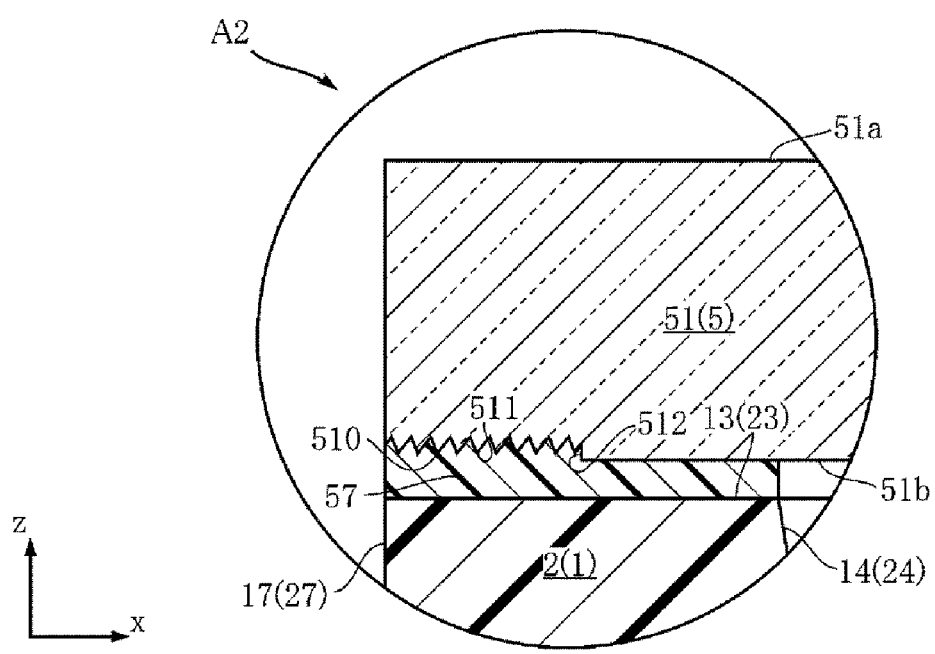
FIG. 20 is an enlarged cross-sectional view of a principal part illustrating a semiconductor light-emitting device according to a second embodiment of the present disclosure.

FIG. 20 illustrates a semiconductor light-emitting device according to a second embodiment of the present disclosure. In a semiconductor light-emitting device A2 of the present embodiment, a specific configuration of the undulation part 510 is different from that of the aforementioned embodiment. In the present embodiment, the undulation part 510 is formed by a rough surface having a surface roughness rougher than that of the rear surface 51b.

The shape, position, and number of undulation parts 510 are not particularly limited, and for example, the configuration of the undulation parts 510 of the aforementioned embodiment may be appropriately employed. Moreover, a method of installing a rough surface corresponding to the undulation parts 510 by, for example, performing a sand blasting process on a mold for forming the base layer 51, may be used as a method of forming the undulation parts 510 of the present embodiment.

Even in the present embodiment, it is possible to suppress the detachment of the cover 5. Furthermore, the base layer 51 including the undulation parts 510 having a rough surface is preferable for thickness reduction.

Third Embodiment

Figure 21:
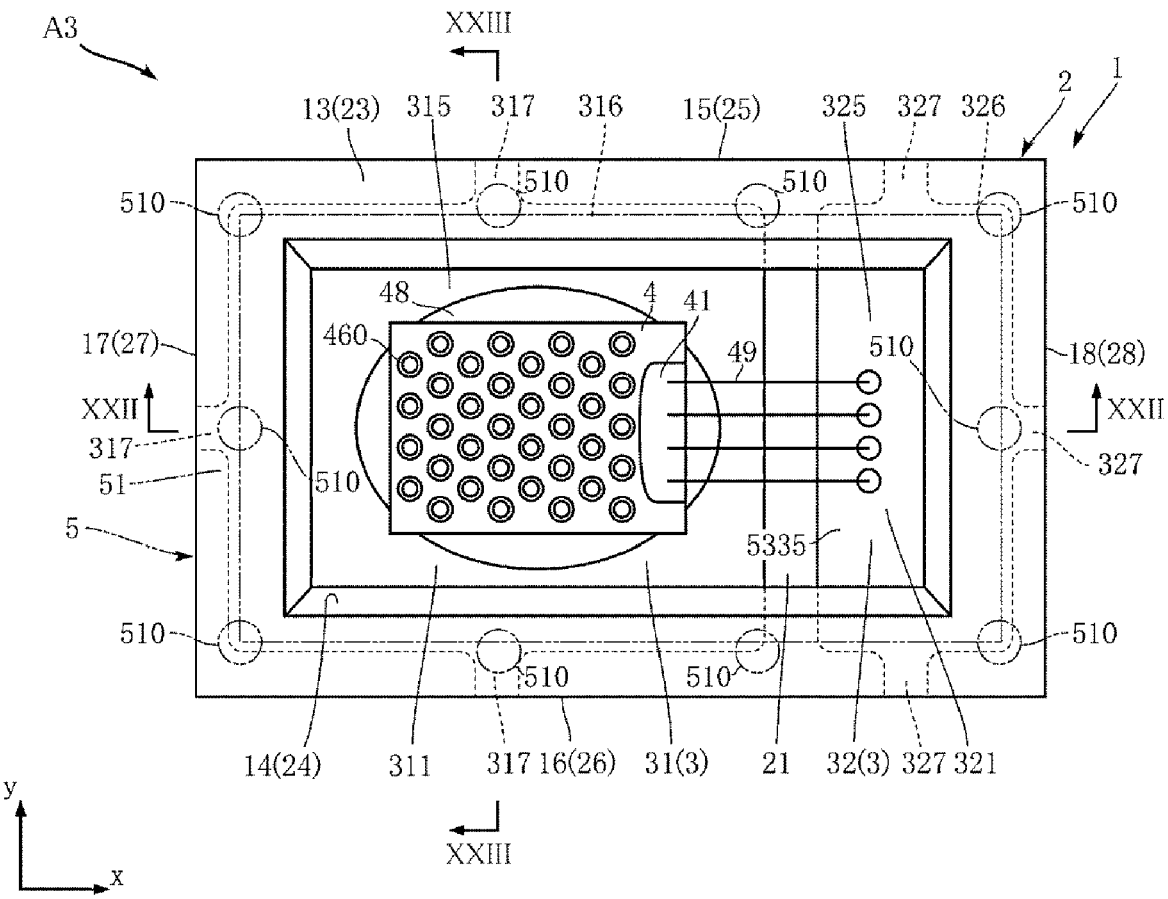
FIG. 21 is a plan view of a principal part illustrating a semiconductor light-emitting device according to a third embodiment of the present disclosure.
Figure 22:
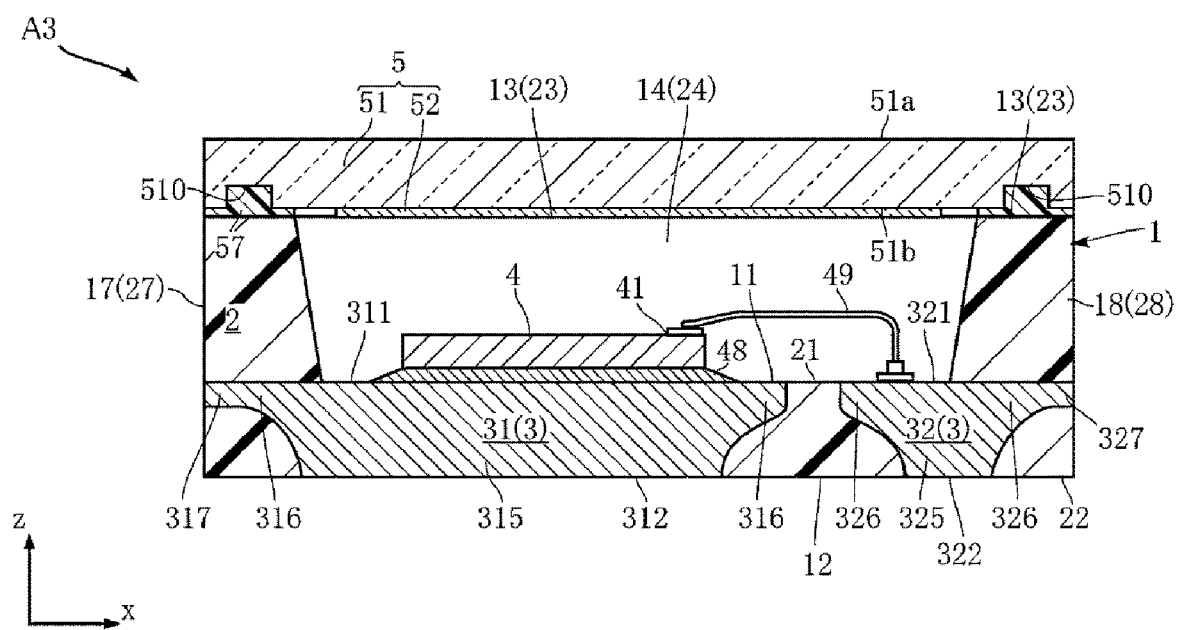
FIG. 22 is a cross-sectional view taken along a line XXII-XXII in FIG. 21.
Figure 23:
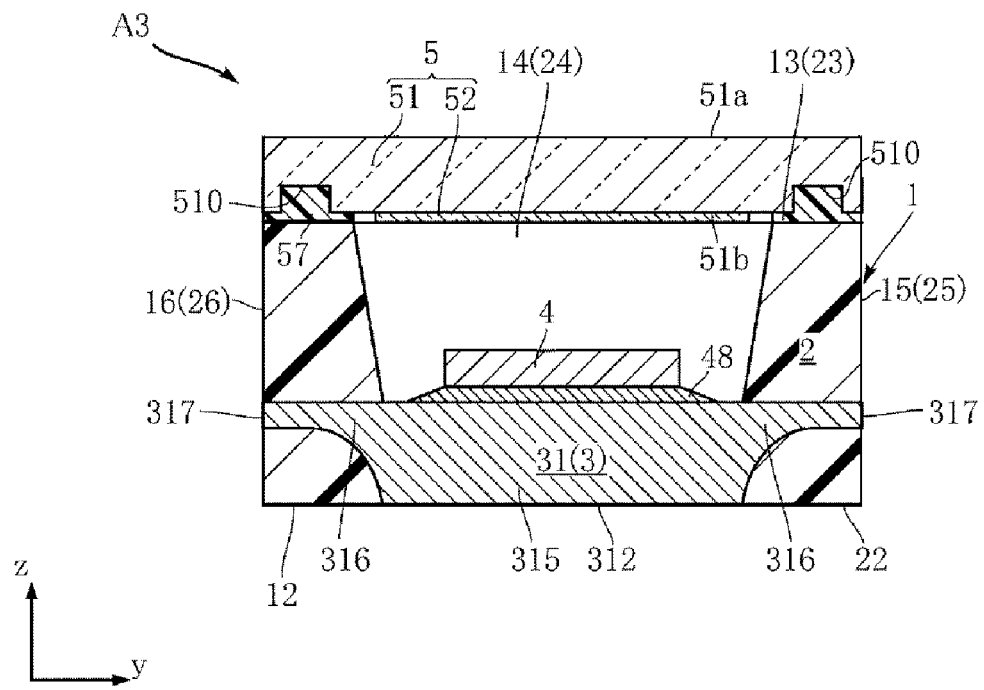
FIG. 23 is a sectional view taken along a line XXIII-XXIII in FIG. 21.

FIGS. 21 to 23 illustrate a semiconductor light-emitting device according to a third embodiment of the present disclosure. In a semiconductor light-emitting device A3 of the present embodiment, a specific configuration of the undulation part 510 is different from that of the aforementioned embodiments.

In the present embodiment, the undulation part 510 is constituted by a hole. The hole constituting the undulation part 510 includes the first surface 511, is opened to the rear surface 51b in the z direction, and is closed to the front surface 51a. In addition, the hole constituting the undulation part 510 has a closed shape as viewed in the z direction. The shape of the hole constituting the undulation part 510 is not particularly limited, and is circular in the illustrated example. The undulation part 510 is filled with the bonding material 57.

The entire undulation part 510 overlaps the third surface 13 (third surface 23) as viewed in the z direction. The number of undulation parts 510 is not particularly limited, and is 10 in the illustrated example. These undulation parts 510 are arranged in an annular shape surrounding the fourth surface 14 (fourth surface 24) and the rear surface 51b. These undulation parts 510 include those arranged apart from each other in the x direction, those arranged apart from each other in the y direction, and the like.

Even in the present embodiment, it is possible to suppress the detachment of the cover 5. In addition, since the undulation parts 510 each have a closed shape as viewed in the z direction, it is possible to reduce an area of the bonding material 57 appearing externally when the semiconductor light-emitting device A3 is viewed from the x direction or the y direction.

Fourth Embodiment

Figure 24:
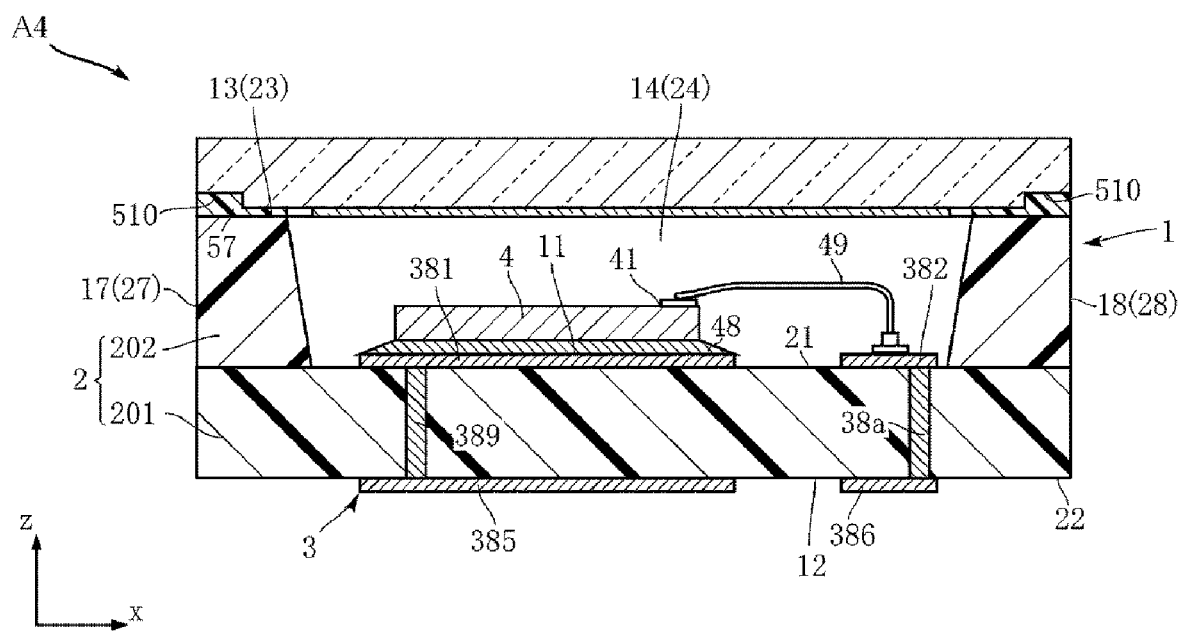
FIG. 24 is a cross-sectional view illustrating a semiconductor light-emitting device according to a fourth embodiment of the present disclosure.

FIG. 24 is a cross-sectional view illustrating a semiconductor light-emitting device A4 according to a fourth embodiment of the present disclosure. The support 1 of the present embodiment has a configuration similar to that of the support 1 of the semiconductor light-emitting device A1, but has a different specific structure and is constituted by a so-called multilayer wiring board.

The base 2 of the present embodiment includes a first layer 201 and a second layer 202. The first layer 201 and the second layer 202 are each made of an insulating material, for example, a glass epoxy resin.

The conductive part 3 has a first part 381, a second part 382, a third part 383, a fifth part 385, a sixth part 386, a ninth part 389, and a tenth part 38a. The first part 381, the second part 382, the third part 383, the fifth part 385, the sixth part 386, the ninth part 389, and the tenth part 38a are each formed of metal, for example, a plating layer such as Cu, Ni, Au or the like.

The first part 381 is formed on the first layer 201, and has the same shape, size, and arrangement as, for example, those of the first surface 311 in the semiconductor light-emitting device A1, as viewed in the z direction. The second part 382 is formed on the first layer 201, and has the same shape, size, and arrangement as, for example, those of the first surface 321 in the semiconductor light-emitting device A1, as viewed in the z direction. The third part 383 is formed on the first layer 201, and has the same shape, size, and arrangement as, for example, those of the first surface 331 in the semiconductor light-emitting device A1, as viewed in the z direction. In addition, it may further have a portion where the shape, size, and arrangement as viewed in the z direction are similar to those of the first surface 341 in the semiconductor light-emitting device A1.

The fifth part 385 is formed on the second surface 22 of the first layer 201, and has the same shape, size, and arrangement as, for example, those of the second surface 312 in the semiconductor light-emitting device A1, as viewed in the z direction. The sixth part 386 is formed on the second surface 22 of the first layer 201, and has the same shape, size, and arrangement as, for example, those of the second surface 322 in the semiconductor light-emitting device A1, as viewed in the z direction.

The ninth part 389 penetrates the first layer 201 in the z direction, and is connected to the first part 381 and the fifth part 385. The tenth part 38a penetrates the first layer 201 in the z direction, and is connected to the second part 382 and the sixth part 386. The eleventh part 38b penetrates the first layer 201 in the z direction, and is connected to the third part 383 and the seventh part 387.

Even in this embodiment, it is possible to suppress the detachment of the cover 5. Furthermore, the specific structure of the support 1 is not limited at all as is understood from the present embodiment.

Fifth Embodiment

Figure 25:
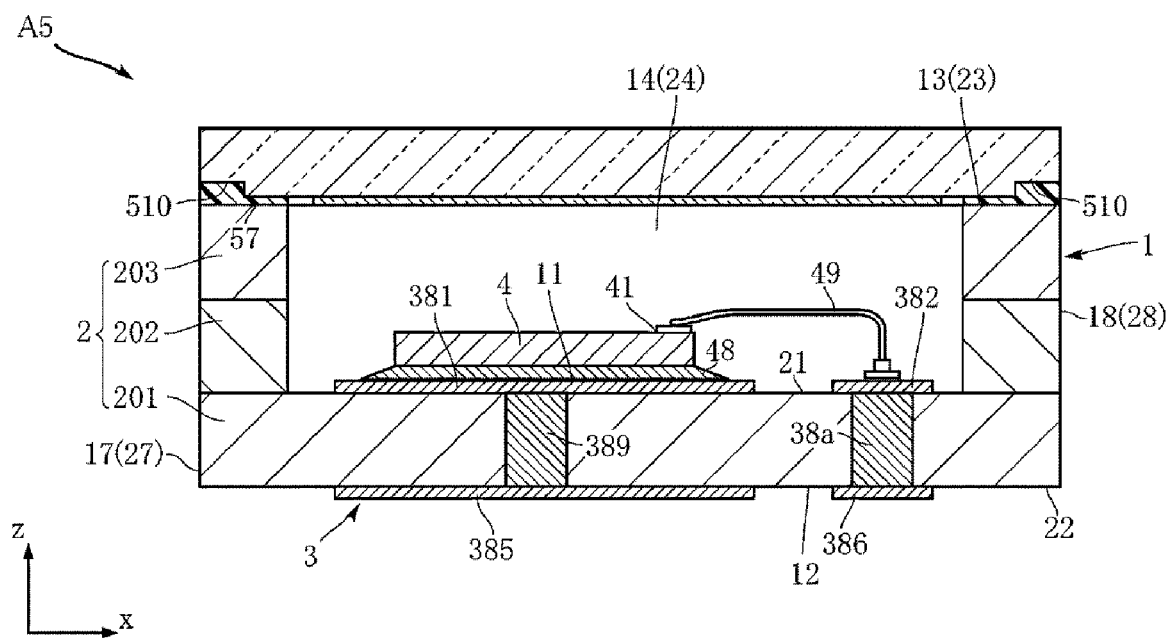
FIG. 25 is a cross-sectional view illustrating a semiconductor light-emitting device according to a fifth embodiment of the present disclosure.

FIG. 25 is a cross-sectional view illustrating a semiconductor light-emitting device A5 according to a fifth embodiment of the present disclosure. The support 1 of the present embodiment has a configuration similar to that of the support 1 of the semiconductor light-emitting device A1, but has a different specific structure and is constituted by a so-called ceramic wiring board.

The base 2 of the present embodiment includes the first layer 201, the second layer 202, and a third layer 203. The first layer 201, the second layer 202, and the third layer 203 are each made of ceramics such as alumina or the like. The fourth surface 14 of the present embodiment has a shape along the z direction. The configuration of the conductive part 3 is similar to, for example, that of the conductive part 3 in the semiconductor light-emitting device A4.

Even in this embodiment, it is possible to suppress the detachment of the cover 5. Furthermore, the specific structure of the support 1 is not limited at all as understood from the present embodiment.

The semiconductor light-emitting device according to the present disclosure is not limited to the aforementioned embodiments. The specific configurations of the respective parts of the semiconductor light-emitting device according to the present disclosure may be variously modified in design.

For example, the semiconductor light-emitting device of the present disclosure may further include a light-receiving element. By including the light-receiving element, the light emission state of the semiconductor light-emitting element can be monitored from the output signal of the light-receiving element.

[Supplemental Notes]
[Supplemental Note 1]
A semiconductor light-emitting device, including:
a semiconductor light-emitting element;
a support including a base and a conductive part and configured to support the semiconductor light-emitting element; and
a cover configured to overlap the semiconductor light-emitting element as viewed in a first direction, and to transmit light from the semiconductor light-emitting element,
wherein the cover includes a base layer having a front surface and a rear surface which transmit the light from the semiconductor light-emitting element and face opposite sides to each other in the first direction,
wherein the rear surface faces the semiconductor light-emitting element,
wherein the base layer includes a plurality of undulation parts bonded to the support by a bonding material, and
wherein the undulation parts are more uneven than the rear surface.

[Supplemental Note 2]
The device of Supplemental Note 1, wherein each of the undulation parts includes a first surface which faces the same side as the rear surface in the first direction and is located on the front surface side rather than on the rear surface in the first direction.

[Supplemental Note 3]
The device of Supplemental Note 2, wherein each of the undulation parts includes a second surface which is located between the rear surface and the first surface in the first direction and faces a second direction perpendicular to the first direction.

[Supplemental Note 4]
The device of Supplemental Note 3, wherein each of the undulation parts is opened to a side where the second surface faces in the second direction.

[Supplemental Note 5]
The device of Supplemental Note 4, wherein each of the undulation parts includes a third surface which is located between the rear surface and the first surface in the first direction and faces a third direction perpendicular to the first direction and the second direction.

[Supplemental Note 6]
The device of Supplemental Note 5, wherein each of the undulation parts is opened to a side where the third surface faces the third direction.

[Supplemental Note 7]
The device of Supplemental Note 6, wherein the undulation parts include two undulation parts separated from each other in the second direction.

[Supplemental Note 8]
The device of Supplemental Note 6 or 7, wherein the undulation parts include two undulation parts separated from each other in the third direction.

[Supplemental Note 9]
The device of Supplemental Note 6, wherein each of the undulation parts includes an annular shape surrounding the rear surface as viewed in the first direction.

[Supplemental Note 10]
The device of Supplemental Note 2, wherein each of the undulation parts is a hole having a closed shape as viewed in the first direction.

[Supplemental Note 11]
The device of Supplemental Note 1, wherein each of the undulation part includes a rough surface having a surface roughness rougher than a surface roughness of the rear surface.

[Supplemental Note 12]
The device of one of Supplemental Notes 1 to 11, wherein the support includes a first surface on which the semiconductor light-emitting element is arranged and which faces the first direction, a second surface facing an opposite side to the first surface, a third surface that faces the same side as the first surface, is further separated from the second surface than the first surface, and surrounds the first surface as viewed in the first direction, and a fourth surface interposed between the first surface and the third surface, and
wherein the cover is supported on the third surface.

[Supplemental Note 13]
The device of one of Supplemental Notes 1 to 12, wherein the base layer includes a retreat surface which faces the same side as the front surface in the first direction and is located on the rear surface side rather than on the front surface as viewed in the first direction, and overlaps the rear surface and the semiconductor light-emitting element as viewed in the first direction.

[Supplemental Note 14]
The device of Supplemental Notes 1 to 13, wherein the cover includes a diffusion layer configured to diffuse the light from the semiconductor light-emitting element.

[Supplemental Note 15]
The device of Supplemental Note 14, wherein the diffusion layer is configured to overlap the rear surface and the semiconductor light-emitting element when viewed in the first direction.

[Supplemental Note 16]
The device of Supplemental Note 15, wherein the undulation parts are exposed from the diffusion layer.

[Supplemental Note 17]
The device of Supplemental Notes 1 to 16, wherein the semiconductor light-emitting element is a VCSEL element.

According to the present disclosure in some embodiments, it is possible to provide a semiconductor light-emitting device capable of suppressing detachment of a cover.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light-emitting device, comprising:
   a semiconductor light-emitting element;
   a support including a base and a conductive part and configured to support the semiconductor light-emitting element; and
   a cover configured to overlap the semiconductor light-emitting element as viewed in a first direction, and to transmit light from the semiconductor light-emitting element,
   wherein the cover includes a base layer having a front surface and a rear surface which transmit the light from the semiconductor light-emitting element and face opposite sides to each other in the first direction,
   wherein the rear surface faces the semiconductor light-emitting element,
   wherein the base layer includes a plurality of undulation parts that faces the support,
   wherein the undulation parts are more uneven than the rear surface in a first sectional view taken along a second direction perpendicular to the first direction,
   wherein the support includes:
      a first surface on which the semiconductor light-emitting element is arranged;
      a second surface configured to support the base layer, an entire area of the second surface being bonded to the undulation parts via a bonding material to bond the base layer to the support; and
      a third surface that is inclined with respect to the first surface, connected to the first surface and the second surface, and formed to surround the first surface as viewed in the first direction,
   wherein the undulation parts are formed to extend inward more than the second surface as viewed in the first direction, and overlap the third surface as viewed in the first direction,
   wherein the bonding material between the base layer and the second surface fills the undulation parts, and is in contact with a part of the third surface, and
   wherein at an edge portion of the semiconductor light-emitting device in the second direction, a central portion of the base layer is thicker than a peripheral portion of the base layer in a second sectional view taken along a third direction perpendicular to the first direction and the second direction.

2. The device of claim 1, wherein each of the undulation parts includes a first surface which faces a same side as the rear surface in the first direction, and
   wherein a position where the first surface of each of the undulation parts is located is closer to the front surface than a position where the rear surface is located in the first direction.

3. The device of claim 2, wherein each of the undulation parts includes a second surface which is located between the first surface of each of the undulation parts and the rear surface in the first direction and faces the second direction perpendicular to the first direction.

4. The device of claim 3, wherein each of the undulation parts is opened to a side where the second surface of each of the undulation parts faces in the second direction.

5. The device of claim 4, wherein each of the undulation parts includes a third surface which is located between the rear surface and the first surface of each of the undulation parts in the first direction and faces the third direction perpendicular to the first direction and the second direction.

6. The device of claim 5, wherein each of the undulation parts is opened to a side where the third surface of each of the undulation parts faces the third direction.

7. The device of claim 6, wherein the undulation parts include two undulation parts separated from each other in the second direction.

8. The device of claim 6, wherein the undulation parts include two undulation parts separated from each other in the third direction.

9. The device of claim 6, wherein each of the undulation parts has an annular shape surrounding the rear surface as viewed in the first direction.

10. The device of claim 2, wherein each of the undulation parts is a hole having a closed shape as viewed in the first direction.

11. The device of claim 1, wherein each of the undulation parts includes a rough surface having a surface roughness rougher than a surface roughness of the rear surface.

12. The device of claim 1, wherein the support further includes an additional surface facing an opposite side to the first surface.

13. The device of claim 12, wherein the conductive part includes a first lead and a second lead,
   wherein the semiconductor light-emitting element is connected to the first lead and a wire is connected between the semiconductor light-emitting element and the second lead,
   wherein the first lead includes a first surface facing the cover and a second surface facing an opposite direction to the first surface of the first lead, the first surface of the first lead being larger than the second surface of the first lead as viewed in the first direction, and
   wherein the second lead includes a first surface facing the cover and a second surface facing an opposite direction to the first surface of the second lead, the first surface of the second lead being larger than the second surface of the second lead as viewed in the first direction.

14. The device of 13, wherein the first surface of the first lead is flush with the first surface of the second lead, and
   wherein the second surface of the first lead is flush with the second surface of the second lead.

15. The device of claim 1, wherein the base layer includes a retreat surface which faces a same side as the front surface in the first direction,
   wherein a location where the retreat surface is located is closer to the rear surface than a position where the front surface is located in the first direction, and
   wherein the retreat surface overlaps the rear surface and the semiconductor light-emitting element as viewed in the first direction.

16. The device of claim 1, wherein the cover includes a diffusion layer configured to diffuse the light from the semiconductor light-emitting element.

17. The device of claim 16, wherein the diffusion layer is configured to overlap the rear surface and the semiconductor light-emitting element when viewed in the first direction.

18. The device of claim 17, wherein the undulation parts are formed not to overlap the diffusion layer when viewed in the first direction.

19. The device of claim 1, wherein the semiconductor light-emitting element is a VCSEL element.

* * * * *